(12) United States Patent
Ikurumi et al.

(10) Patent No.: US 6,759,917 B2
(45) Date of Patent: Jul. 6, 2004

(54) METHOD AND APPARATUS FOR ADJUSTING IMPEDANCE OF MATCHING CIRCUIT

(75) Inventors: Kazuhiro Ikurumi, Katano (JP);
Shoichi Kajiwara, Moriguchi (JP);
Osamu Kumazawa, Yokohama (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 0 days.

(21) Appl. No.: 09/826,827

(22) Filed: Apr. 6, 2001

(65) Prior Publication Data
US 2002/0056889 A1 May 16, 2002

(30) Foreign Application Priority Data

Apr. 7, 2000 (JP) ........................................ 2000-106563

(51) Int. Cl.⁷ ................................................ H03H 7/38
(52) U.S. Cl. ........................................ 333/17.3; 333/33
(58) Field of Search ........................... 333/17.3, 33, 32, 333/35

(56) References Cited

U.S. PATENT DOCUMENTS 4,825,220 A * 4/1989 Edward et al. ............. 343/795
6,028,564 A * 2/2000 Duan et al. ................. 343/818
6,169,301 B1 * 1/2001 Ishikawa et al. ............ 257/275
6,343,369 B1 * 1/2002 Saunders et al. ............. 716/4
2002/0003496 A1 * 1/2002 Brady et al. ......... 343/700 MS

OTHER PUBLICATIONS

Ponchak et al., "Open– and Short–Circuit Terminated Series Stubs in Finite–Width Coplanar Waveguide on Silicon," Jun. 1997, IEEE Transactions on Microwave Theory and Techniques, vol. 45, No. 6, pp. 970–976.*

* cited by examiner

Primary Examiner—Robert Pascal
Assistant Examiner—Dean Takaoka
(74) Attorney, Agent, or Firm—Wenderoth, Lind & Ponack, L.L.P.

(57) ABSTRACT

Based on a relationship between cutting-and-removing amounts for partly cutting out a stub of a pattern line and impedances of a matching circuit, a cutting-and-removing amount for adjusting the impedance to a target value is determined by simulation or by comparison operation of an impedance measured value with information stored in a database. Then, based on the determined cutting-and-removing amount, the stub of the pattern line is partly cut and removed so that the impedance is adjusted to the target value.

12 Claims, 19 Drawing Sheets

0.15 ~ 0.35 [deg]
(w = 4W/5, L = 0.10 [mm])

12.0 ~ 15.0 [deg]
(w = 4W/5, L = 1.0 [mm])

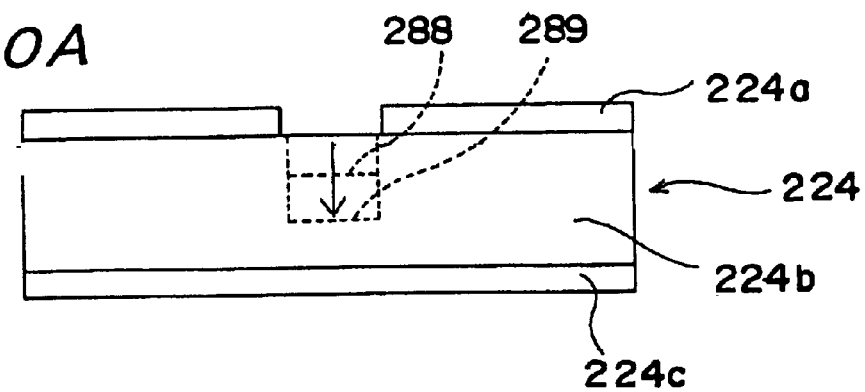
Fig. 30A
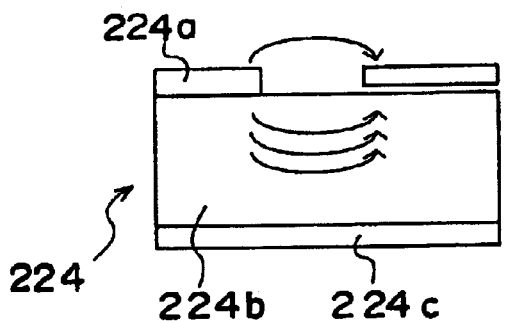
Fig. 30B
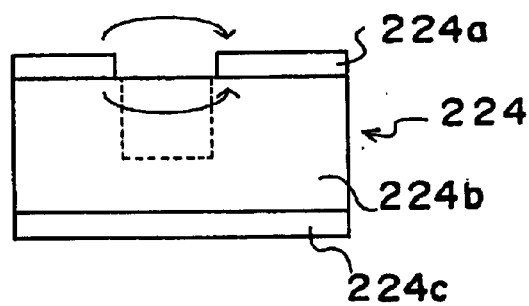
Fig. 30C
Fig. 31
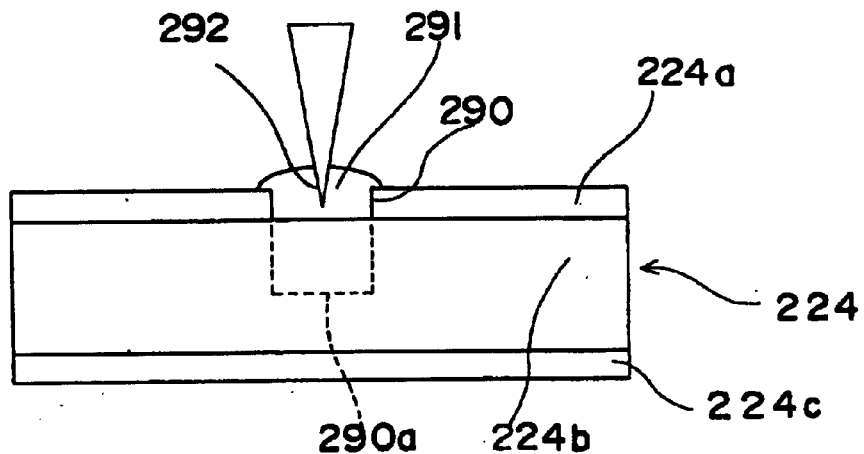

METHOD AND APPARATUS FOR ADJUSTING IMPEDANCE OF MATCHING CIRCUIT

BACKGROUND OF THE INVENTION

The present invention relates to matching-circuit impedance adjusting method and apparatus for adjusting the impedance of a matching circuit having pattern lines.

Conventionally, for transmitting amplifier circuits in telephone base stations, an average power of, for example, 280 W has been required while it has been required to secure an output of such large power, it has moreover been required to amplify and transmit a signal through high-precision signal conversion that allows signal distortion to be suppressed as much as possible, thereby preventing any adverse effects on other communications. In order to meet such a strict demand, it is necessary to adjust the impedances of chip capacitors 102, 103 for a multiplicity of transistors 101 used in the transmitting amplifier circuits of a base station by adjusting the constants and placement positions of the chip capacitors 102, 103 with a soldering iron as shown in FIG. 33.

In this impedance adjustment, it is required to convert from several ohms to 50 ohms to 1 or 2 ohms as an example. In order that such large output performance can be be ensured, it is necessary, in the impedance adjustment, to perform the adjustment work within a low degree of freedom to achieve the matching of passive components. By way of a concrete example of the adjustment, given that moving the capacitors 102, 103 by 1 mm causes the center frequency to shift by 30 MHz as an example, the precision requirement, which is in several MHz, demands positional adjustment on the order of the first decimal place, thus making the adjustment work very difficult.

Also, conventional impedance adjustment places result from the combination of 8 parameters consisting of individual positions of two input capacitors and two output capacitors as well as their respective constants. Such mixed adjustment work at plural sites would involve mutual effects among individual processes for the work, resulting in complex adjustment work. Thus, there has been an issue that the conventional adjustment time would be at least 10 minutes or more as an example and, in some cases, several hours.

An example of the method for a adjustment is a cut-and-try process. In this process, for example, first in a coarse adjustment, the best position is adjusted with a capacitor of large capacity (1:5 pf) to determine the best gain and the best position, the best position is again adjusted and determined with 1.8 of pf and further with about 2.2 pf–5 pf, and then the capacitor is fixedly set in its best condition. Next, in a fine adjustment, with a capacitor of small capacity (0.1 pf) added for the fine adjustment, the fine adjustment is carried out in the same manner as in the coarse adjustment, the best position is adjusted with 0.2 pf to determine the best gain and the best position, and the best position is again adjusted and determined with 0.5 pf. By repeating this process, the capacitor is fixedly set in its best condition. However, since this process is performed by manual work, there have been issues that significant variations would occur among workers and that longer working time would be required.

Accordingly, an object of the present invention is to solve the above-described issues and to provide method and apparatus for adjusting the impedance of a matching circuit by which the impedance adjustment can be achieved in shorter time while ensuring high precision.

SUMMARY OF THE INVENTION

In order to achieve the above object, the present invention has the following constitutions.

According to a first aspect of the present invention, there is provided a matching-circuit impedance adjusting method for adjusting impedance of a matching circuit by, in a matching circuit having a pattern line, partly cutting out a stub protruding widthwise from the pattern line, the method comprising: at occurrence of an excessive cut-out of the stub, forming an auxiliary cut-and-removed portion by partly cutting and removing the stub so that the stub is made apparently longer.

According to a second aspect of the present invention, there is provided a matching-circuit impedance adjusting method according to the first aspect, further comprising:

based on a relationship between cutting-out amounts for partly cutting out the stub of the pattern line and impedances of the matching circuit as well as a relationship between cutting-and-removing amounts of the auxiliary cut-and-removed portion for partly cutting and removing the stub and impedances of the matching circuit, determining a cutting-out amount, or a cutting-and-removing amount, or a cutting-out amount and a cutting-and-removing amount, for adjusting the impedance of the matching circuit to a target value by simulation or by comparison operation of an impedance measured value with information in a database; and based on the cutting-out amount, or the cutting-out amount and the cutting-and-removing amount, of the stub determined by the simulation or by the comparison operation of the impedance measured value with the information in the database, partly cutting out or cutting and removing the stub, so that the impedance of the matching circuit is adjusted to the target value.

According to a third aspect of the present invention, there is provided a matching-circuit impedance adjusting method according to the first aspect, further comprising: in partly cutting and removing the stub to form the auxiliary cut-and-removed portion, forming a slit along a widthwise direction of the stub.

According to a fourth aspect of the present invention, there is provided a matching-circuit impedance adjusting method according to the third aspect, wherein the slit is formed three or more in number in the stub of the pattern line so that the three or more slits are formed into comb-teeth-like cuts.

According to a fifth aspect of the present invention, there is provided a matching-circuit impedance adjusting method according to the third aspect, wherein the slit is formed three or more in number in the stub of the pattern line so that the three or more slits are formed into staggered cuts.

According to a sixth aspect of the present invention, there is provided a matching-circuit impedance adjusting method according to the first or second aspect, further comprising: in partly cutting and removing the stub of the pattern line to form the auxiliary cut-and-removed portion, forming a cut-out along a widthwise direction of the stub of the pattern line.

According to a seventh aspect of the present invention, there is provided a matching-circuit impedance adjusting method according to the first or second aspect, further comprising: in partly cutting and removing the stub of the pattern line to form the auxiliary cut-and-removed portion, forming a hook-type slit in the stub of the pattern line.

According to an eighth aspect of the present invention, there is provided a matching-circuit impedance adjusting method according to any one of the first through seventh aspects, wherein the cutting-out amount, or the cutting-and-removing amount, or the cutting-out amount and cutting-and-removing amount, of each stub of the pattern line are made different from one another.

According to a ninth aspect of the present invention, there is provided a matching-circuit impedance adjusting method according to any one of the first through eighth aspects, further comprising: changing the cutting-and-removing amount of the auxiliary cut-and-removed portion in a thicknesswise direction of the stub of the pattern line, thereby performing the impedance adjustment.

According to a 10th aspect of the present invention, there is provided a matching-circuit impedance adjusting method according to any one of the first through ninth aspects, wherein the auxiliary cut-and-removed portion is formed by, with a recessed portion previously formed along a thicknesswise direction of the stub of the pattern line, burying an insulating resin in the recessed portion and then cutting and removing the insulating resin to form the auxiliary cut-and-removed portion.

According to an 11th aspect of the present invention, there is provided a matching-circuit impedance adjusting method according to any one of the first through 10th aspects, further comprising: performing fine adjustment in accordance with impedance characteristic by combining a widthwise cutting-and-removing of the stub of the pattern line and a thicknesswise cutting-and-removing of the stub of the pattern line.

According to a 12th aspect of the present invention, there is provided a matching-circuit impedance adjusting method according to any one of the first through 11th aspects, further comprising: with an impedance variation amount on a Smith chart changed by length and width of the auxiliary cut-and-removed portion, adjusting the impedance of the matching circuit to the target value based on a phase on the impedance.

According to a 13th aspect of the present invention, there is provided a matching-circuit impedance adjusting method according to any one of the first through 12th aspects, wherein the auxiliary cut-and-removed portion is formed by partly cutting and removing the stub with a laser beam.

According to a 14th aspect of the present invention, there is provided a matching-circuit impedance adjusting apparatus comprising:

- a laser irradiation device for irradiating a stub of a pattern line of a matching circuit having the pattern line with a laser beam to partly cut and remove the stub of the pattern line, thereby forming an auxiliary cut-and-removed portion;
- a measuring instrument for measuring an impedance of the matching circuit;
- a storage section for previously storing a relationship between cutting-out amounts for partly cutting out the stub of the pattern line with the laser beam and impedances of the matching circuit, as well as a relationship between cutting-and-removing amounts of auxiliary cut-and-removed portions for partly cutting and removing the stub of the pattern line with the laser beam and impedances of the matching circuit; and
- an operating section for, based on the relationships stored in the storage section, determining a cutting-out amount, the cutting-and-removing amount, or a cutting-out amount and a cutting-and-removing amount, for adjusting the impedance of the matching circuit to a target value, by simulation or by comparison operation of an impedance measured value with information stored in a database, wherein the impedance adjusting apparatus performs: irradiating the stub of the pattern line with the laser beam to partly cut out, or cut and remove, the stub of the pattern line based on the cutting-out amount, or the cutting-out amount and the cutting-and-removing amount, determined by the simulation or by the comparison operation of the impedance measured value at the operating section with the information stored in the database; then measuring the impedance of the matching circuit with the measuring instrument; and comparing an impedance measured value measured by the measuring instrument with the target value at the operating section, where if the two values have a difference therebetween beyond a permissible range, the impedance adjusting apparatus performs: irradiating the stub of the pattern line with the laser beam to partly cut out, or cut and remove, the stub of the pattern line with the laser beam, based on a cutting-out amount, or a cutting-out amount and the cutting-and-removing amount, determined again with the operating section by the simulation or by the comparison operation of the impedance measured value with the information stored in the database by means of the operating section.

According to a 15th aspect of the present invention, there is provided a matching-circuit impedance adjusting apparatus according to the 14th aspect, wherein in forming the auxiliary cut-and-removed portion by partly cutting and removing the stub of the pattern line with the laser beam applied from the laser irradiation device, a slit is formed widthwise of the stub of the pattern line with the laser beam.

According to a 16th aspect of the present invention, there is provided a matching-circuit impedance adjusting apparatus according to the 15th aspect, wherein the the slit formed with the laser beam applied from the laser irradiation device is formed three or more in number in the stub of the pattern line so that the three or more slits are formed into comb-teeth-like cuts.

According to a 17th aspect of the present invention, there is provided a matching-circuit impedance adjusting apparatus according to the 15th or 16th aspect, wherein the slit formed with the laser beam applied from the laser irradiation device is formed three or more in the stub of the pattern line so that the three or more slits are formed into staggered cuts.

According to an 18th aspect of the present invention, there is provided a matching-circuit impedance adjusting apparatus according to the 14th aspect, wherein in partly cutting and removing the stub of the pattern line to form the auxiliary cut-and-removed portion with the laser beam applied from the laser irradiation device to form the auxiliary cut-and-removed portion, a cut-out is formed along a widthwise direction of the stub of the pattern line with the laser beam.

According to a 19th aspect of the present invention, there is provided a matching-circuit impedance adjusting apparatus according to the 14th aspect, wherein in partly cutting and removing the stub of the pattern line with the laser beam applied from the laser irradiation device to form the auxiliary cut-and-removed portion, a hook-type slit is formed in the stub of the pattern line with the laser beam.

According to a 20th aspect of the present invention, there is provided a matching-circuit impedance adjusting apparatus according to any one of the 14th through 19th aspects, wherein the cutting-out amount, or the cutting-and-removing amount, or the cutting-out amount and cutting-and-removing amount for each stub of the pattern line are made different from one another.

According to a 21st aspect of the present invention, there is provided a matching-circuit impedance adjusting apparatus according to any one of the 14th through 20th aspects, wherein the impedance adjustment is performed by changing the cutting-and-removing amount of the auxiliary cut-and-removed portion in a thicknesswise direction of the stub of the pattern line.

According to a 22nd aspect of the present invention, there is provided a matching-circuit impedance adjusting apparatus according to any one of the 14th through 21st aspects, wherein the auxiliary cut-and-removed portion is formed by, with a recessed portion previously formed along a thicknesswise direction of the stub of the pattern line, burying an insulating resin in the recessed portion, and then cutting and removing the insulating resin with a laser beam applied from the laser irradiation device.

According to a 23rd aspect of the present invention, there is provided a matching-circuit impedance adjusting apparatus according to any one of the 14th through 22nd aspects, wherein fine adjustment is performed in accordance with impedance characteristic by combining a widthwise cutting-and-removing of the stub of the pattern line and a thicknesswise cutting-and-removing of the stub of the pattern line.

According to a 24th aspect of the present invention, there is provided a matching-circuit impedance adjusting apparatus according to any one of the 14th through 23rd aspects, wherein with impedance variation amount on a Smith chart changed by length and width of the auxiliary cut-and-removed portion formed with the laser beam applied to the laser irradiation device, the impedance of the matching circuit is adjusted to the target value based on a phase on the impedance.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 30A, 30B and 30C are explanatory views for explaining matching-circuit impedance adjusting methods according to a third embodiment of the present invention, respectively;

FIG. 31 is an explanatory view for explaining a matching-circuit impedance adjusting method according to a fourth embodiment of the present invention;

DETAILED DESCRIPTION OF THE PREFERRED EMBODIMENTS

Figure 1:
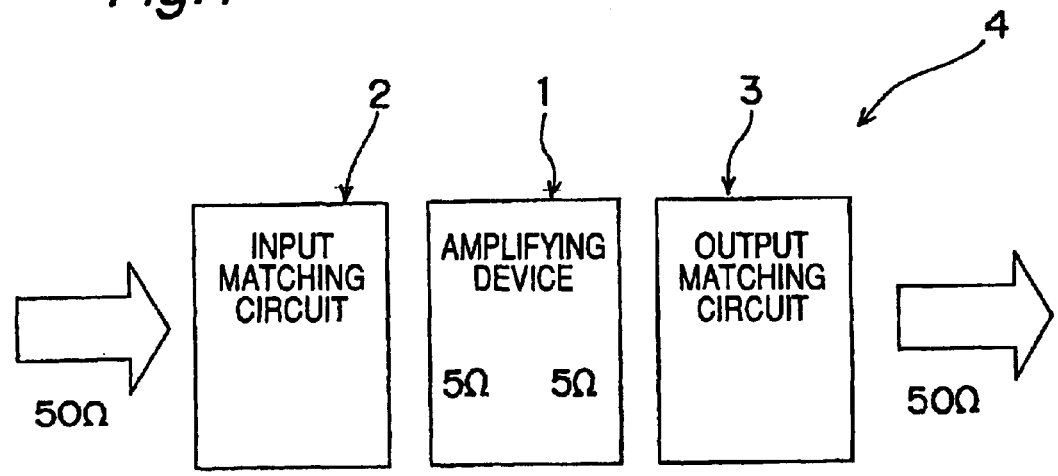
FIG. 1 is a schematic diagram of a power amplifier circuit for use in a base station to which the matching-circuit impedance adjusting method according to a first embodiment of the present invention is applied.

Before the description of the present invention proceeds, it is to be noted that like parts are designated by like reference numerals throughout the accompanying drawings.

Hereinbelow, the present invention is described in detail by way of embodiments thereof illustrated in the accompanying drawings.

Figure 2:
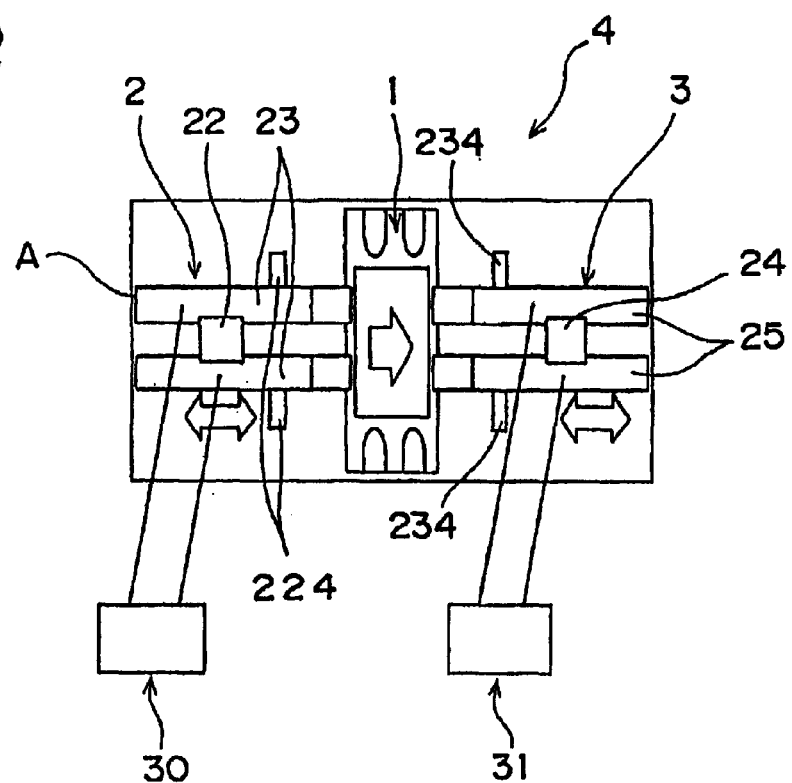
FIG. 2 is a detailed diagram of the power amplifier circuit of FIG. 1.
Figure 5A:
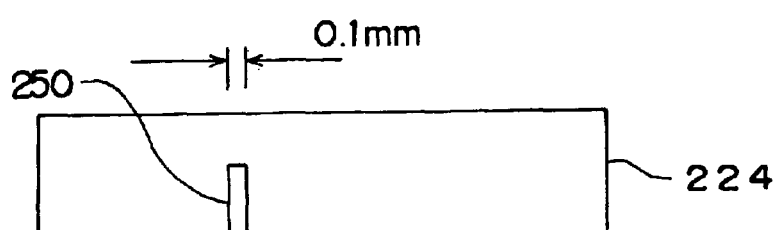
FIGS. 5A and 5B are explanatory views of stubs in a pattern line, respectively, each having an auxiliary cut-and-removed portion to be cut out and removed in the impedance adjusting method according to the first embodiment of the present invention.

A matching-circuit impedance adjusting method according to a first embodiment of the present invention has the following constitution. That is, as shown in FIGS. 1 and 2, in matching circuits 2, 3 composed of pattern lines 23, 23 and 25, 25 and capacitors 22, 24, respectively, in adjusting the impedances of the matching circuits 2, 3 by partly cutting out stubs 224, 224 and 234, 234 widthwise protruding from the pattern lines 23, 23 and 25, 25 with a laser beam, or by partly cutting-and-removing the stubs 224, 224 and 234, 234 with a laser beam to form auxiliary cut-and-removed portions 250 (see FIG. 5A), or by combining the above-mentioned cutting-out and cutting-and-removing processes, cutting-out amounts for the first and second cut-out portions 221, 222 or the like or cutting-and-removing amounts for the auxiliary cut-and-removed portions 250 or combined amounts of those amounts for adjusting the impedances of the matching circuits 2, 3 to target values are determined by simulation or by comparison operation of impedance measured values with information stored in a database, based on the relationship between the cutting-out amounts for the first and second cut-out portions 221, 222 or the like to be cut out with the laser beam and the impedances of the matching circuits 2, 3, the relationship between the cutting-and-removing amounts for the auxiliary cut-and-removed portions 250 to be cut-and-removed and the impedances of the matching circuits 2, 3, and the relationship between the combinations of above-mentioned cutting-out amounts and cutting-and-removing amounts and the impedances of the matching circuits 2, 3. Then, in the adjustment, the stubs 224, 224 and 234, 234 of the pattern lines 23, 23 and 25, 25 are partly cut out with the laser beam to form the first and second cut-out portions 220, 221 or cut-and-removed with the laser beam to form the auxiliary cut-and-removed portions 250 or both of those portions are formed, based on the cutting-out amounts for the first and second cut-out portions 221, 222 or the like or the cutting-and-removing amounts for the auxiliary cut-and-removed portions 250 or the combined amounts of those amounts determined by the simulation or the comparison operation with the information as to impedance measured values stored in the database, by which the impedances of the matching circuits 2, 3 are adjusted to the target values.

Figure 8:
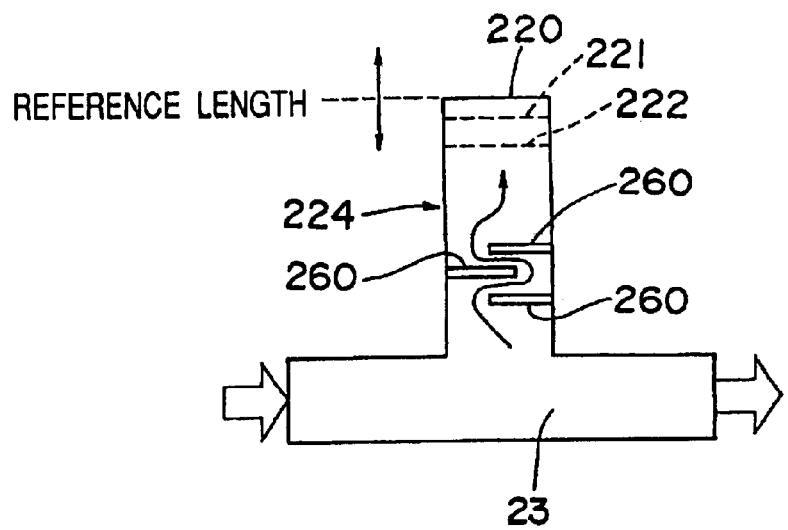
FIG. 8 is an explanatory view of a stub in a pattern line in which linear slits are formed in the impedance adjusting method.

It is noted that, referring to FIG. 8, forming the first and second cut-out portions 221, 222 or the like means providing a first cut-out portion extending to a length from an end of a reference length 220 of a stub 234 (since the stub 214 is identical with the stub 224, the following description will be focused on the stub 224 as a typical example), and further the second cut-out portion 222 extending to the same or another length, and the like, in other words, making the length of the stub 224 shorter and shorter than the reference length 220. Also, forming the cut-and-removed portions 250 means forming auxiliary cut-and-removed portions such as slits 260, a cut-out 270, and a hook-type slit 280 in the stub 224 in FIG. 8.

In this conjunction, a power amplifier circuit 4 for use at a base station as an example of the circuit to be adjusted to which the matching-circuit impedance adjusting method according to the first embodiment is applied, as shown in FIG. 1, is generally composed of an input matching circuit 2, an amplifying device (active device) 1 such as an FET (Field Effect Transistor) to which the input matching circuit 2 is connected at its input side and which has an amplification function, and an output matching circuit 3 connected to the output side of the amplifying device 1. It is noted that power supply or the like may be included as constituent elements of the power amplifier circuit 4.

As a more concrete example of the power amplifier circuit 4, there has been one which is so constructed that when an input signal of a 50 Ω impedance is inputted to an input-side terminal of the input matching circuit 2 of the power amplifier circuit 4, the signal is received by the input matching circuit 2, the amplifying device (having an input impedance of 5 Ω and an output impedance of 5 Ω) 1 provided by an FET, and the output matching circuit 3, so that an output impedance of a 50 Ω signal is outputted from an output-side terminal of the output matching circuit 3 of the power amplifier circuit 4.

The input matching circuit 2 has a function of making the output impedances of signals of the preceding-stage circuits (amplifier and other circuits) of the power amplifier circuit 4 and the input impedance of the amplifying device 1 matched to each other. Matching like this is referred to also as impedance matching.

By doing the matching like this, the total power of the signals derived from the preceding-stage circuit of the power amplifier circuit 4 can be transferred to the subsequent-stage circuit of the power amplifier circuit 4 through the power amplifier circuit 4. With a mismatching, the power of the signal inputted to the input side of the power amplifier circuit 4 would be reflected to the input side of the power amplifier circuit 4, wasting the power and resulting in an issue of lowered efficiency. Also, the signal reflected to the input side and returned to the preceding-stage circuit of the power amplifier circuit 4 may be reflected again at the output part of the preceding-stage circuit of the power amplifier circuit 4 and further repetitively reflected again and again at the input matching circuit 2, resulting in a standing wave, which may cause noise. Similar issues are involved also in the output matching circuit 3.

Generally, input and output impedances of the power amplifier circuit 4 are in many cases set equal to each other (e.g., 50 Ω is predominantly used). In conventional power amplifier circuits, the input and output impedances of the power amplifier circuit are set to 50 Ω, while the input and output impedances of the transistor of the amplifying device 1 are set to 5 Ω. Therefore, the input matching circuit 2 functions to convert 50 Ω, which is the impedances of the power amplifier circuit, to 5 Ω, which is the input impedance of the transistor of the amplifying device 1.

The output matching circuit 3 converts an input impedance of 5 Ω, which is the output impedance of the transistor of the amplifying device 1, to an output impedance of 50 Ω, which is the output impedance of the power amplifier circuit 4. Each of the matching circuits such as the input matching circuit 2 and the output matching circuit 3 is, in many cases, composed of a pair of pattern lines 23, 23, and one or two capacitor(s) 22 placed so as to stretch over the one pair of pattern lines 23, 23, as shown in FIG. 2. Therefore, the following description is made on an example in which the two capacitors 22 shown in FIG. 3, that is, capacitors C1 and C2 are mounted.

Adjustment of matching circuits is performed by the impedance adjusting method of the first embodiment so as to achieve the performances of the above matching circuits 2, 3, respectively. In the following description, although the input matching circuit 2 alone is explained for simplicity's sake, similar adjustment applies also to the output matching circuit 3.

First, a matching-circuit impedance adjusting apparatus capable of embodying the impedance adjusting method of the first embodiment is explained.

Figure 3:
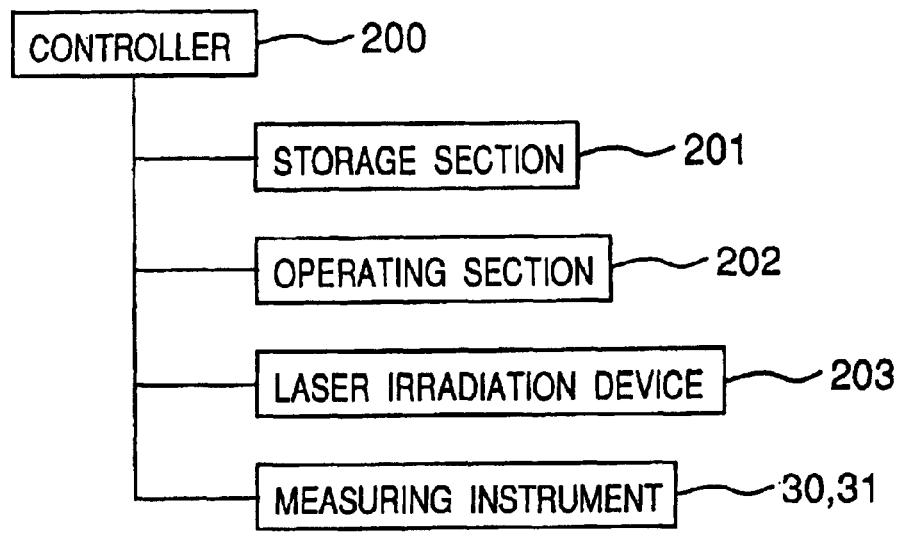
FIG. 3 is a block diagram showing the construction of an impedance adjusting apparatus for embodying the impedance adjusting method according to the first embodiment of the present invention.

As shown in FIG. 3, the matching-circuit impedance adjusting apparatus is made up of a laser irradiation device 203, a measuring instrument 30, a storage section 201, an operating section 202, and a controller 200, where operations of the laser irradiation device 203, the measuring instrument 30, the storage section 201, and the operating section 202 are controlled by the controller 200.

The laser irradiation device 203 irradiates the stub 224 of the pattern line 23 of the matching circuit 2 with a laser beam to partly cut out the stub 224 of the pattern line 23 with the laser beam. In more detail, with respect to a reference length 220 for the stub 224, after the formation of a first cut-out portion 221 having a certain length from an end of the reference length 220 as well as a second cut-out portion 222 or the like having the same or another length, the stub 224 is adjusted so as to be shorter than the reference length 220, or to be apparently longer through the formation of auxiliary cut-and-removed portions 250 such as slits 260, cut-outs 270, and hook-type slits 280. Otherwise, the above-mentioned cut-out and cutting-and-removing processes are combined as required.

The measuring instrument 30 is a measuring instrument (measuring instrument 31 in the output matching circuit 3) such as a network analyzer for measuring the impedance of the input matching circuit 2.

The storage section 201 previously stores the relationship between the cutting-out amounts for the cut-out portions 221, 222 or the like where the stub 224 is cut out partly with a laser beam and the impedances of the matching circuit 2, as well as the relationship between the cutting-and-removing amounts for the auxiliary cut-and-removed portions 250 where the stub 224 is partly cut and removed with the laser beam and the impedances of the matching circuit 2. As required, the storage section 201 also previously stores the relationship between the combinations of the above-mentioned cutting-out amounts and cutting-and-removing amounts and the impedances of the matching circuit 2. Besides, the storage section 201 may store target values. The storage section 201 may further store tolerance ranges with respect to the target values into a database form.

The operating section 202 is implemented by a high-frequency simulator or the like which computes impedances from circuit diagrams or computes circuit parameters from impedances, and based on the above relationship stored in the storage section 201, determines the cutting-and-removing amount for adjusting the impedance of the input matching circuit 2 to the target value by simulation or by comparison operation of the impedance measured value with the information stored in the database.

According to this adjusting apparatus, based on the cutting-out amount for the first or second cut-out portion 221 or 222 or the like or the cutting-and-removing amount for the auxiliary cut-and-removed portion 250 or the combined amounts of those amounts, determined by the operating section 202 through the simulation or through the comparison operation of the impedance measured value with the information stored in the database, the stub 224 of the pattern line 23 is irradiated with a laser beam so that the stub 224 of the pattern line 23 is partly cut out with the laser beam so as to be made shorter than the reference length 220 (see FIG. 8). Thereafter, the impedance of the input matching circuit 2 is measured by the measuring instrument 30, and the measured value of the impedance measured by the measuring instrument 30 is compared with the target value by the operating section 202. If the two values has a difference beyond the permissible range or tolerance, then the simulation or the comparison operation of the impedance measured value with the information stored in the database is performed again by the operating section 202 based on the difference. Based on the new cutting-out amount for the first or second cut-out portion 221 or 222 or the like or the new cutting-and-removing amount for the auxiliary cut-and-removed portion 250 or the new combined amounts of those amounts, determined by the simulation or the comparison operation of the impedance measured value with the information stored in the database, the stub 224 of the pattern line 23 is irradiated with a laser beam so that the stub 224 of the pattern line 23 is partly cut out with the laser beam so as to be shorter than the reference length 220, or the stub 224 of the pattern line 23 is irradiated with a laser beam so that the stub 224 of the pattern line 23 is partly cut and removed with the laser beam, by which the auxiliary cut-and-removed portion such as the slit 260, the cut-out 270, or the hook-type slit 280 is formed in the stub 224. Otherwise, the above-mentioned cut-out and cutting-and-removing processes are combined as required. It is noted that there is another method which achieves the adjustment not by directly measuring the impedance but by measuring various characteristics of the amplifier such as a frequency characteristic.

The matching-circuit impedance adjusting method performed by using the above-described adjusting apparatus is described below in detail with reference to FIG. 4.

For adjustment of the impedance of the input matching circuit 2 by the formation of cut-out portions 221, 222 which is done by preliminarily partly cutting out the stub 224 of the pattern line 23 with a laser beam to thereby form the cut-out portion 221 or 222, or for the adjustment of the impedance of the input matching circuit 2 by the formation of the cut-and-removed portions 250 which is done by partly cutting and removing the stub 224 with a laser beam, information as to the relationship between the cutting-out amounts for cutting out the first and second cut-out portions 221, 222 or the like with the laser beam and the impedances of the matching circuits 2, 3, and information as to the relationship between the cutting-and-removing amounts for the cut-and-removed portions 250 to be cut and removed and impedances of the matching circuits 2, 3, and information as to the relationship between combinations of the cutting-out amount(s) and the cutting-and-removing amount(s) and the impedances of the matching circuits 2, 3, for example, relational expressions or relational graphs or tables, are determined and stored in the storage section 201. More specifically, the stub 224 of the pattern line 23 is partly cut out with a laser beam by forming the first cut-out portion 221, the second cut-out portion 222, or the like at end portions of the stub 224 so that the stub 224 is made shorter and shorter than the reference length 220, during which the relational information between the length of the stub 224 after each cut-out and the impedance of the input matching circuit 2, as well as the relational information between the cutting-and-removing amounts for forming the auxiliary cut-and-removed portions such as the slit 260, the cut-out 270, and the hook-type slit 280 by partly cutting and removing the stub 224 of the pattern line 23 and the impedances of the input matching circuit 2 are determined, and stored in the storage section 201. As required, the relational information between the combinations of the first cut-out portion 221, the second cut-out portion 222, or the like and the auxiliary cut-and-removed portions such as the slit 260, the cut-out 270, and the hook-type slit 280 and the impedances of the input matching circuit 2 are also determined, and stored into the storage section 201. Results of this process are used as information sources for deciding as to which is preferable, to adopt the singularity of the first cut-out portion 221 or the second cut-out portion 222 or the like singly or to adopt the singularity of the auxiliary cut-and-removed portions 250 such as the slit 260, the cut-out 270, the hook-type slit 280, or the like, or to adopt combinations of the first cut-out portion 221, the second cut-out portion 222, or the like and the auxiliary cut-and-removed portion 250 such as slit 260, the cut-out 270, the hook-type slit 280, or the like, with respect to one impedance value of the input matching circuit 2.

Figure 4:
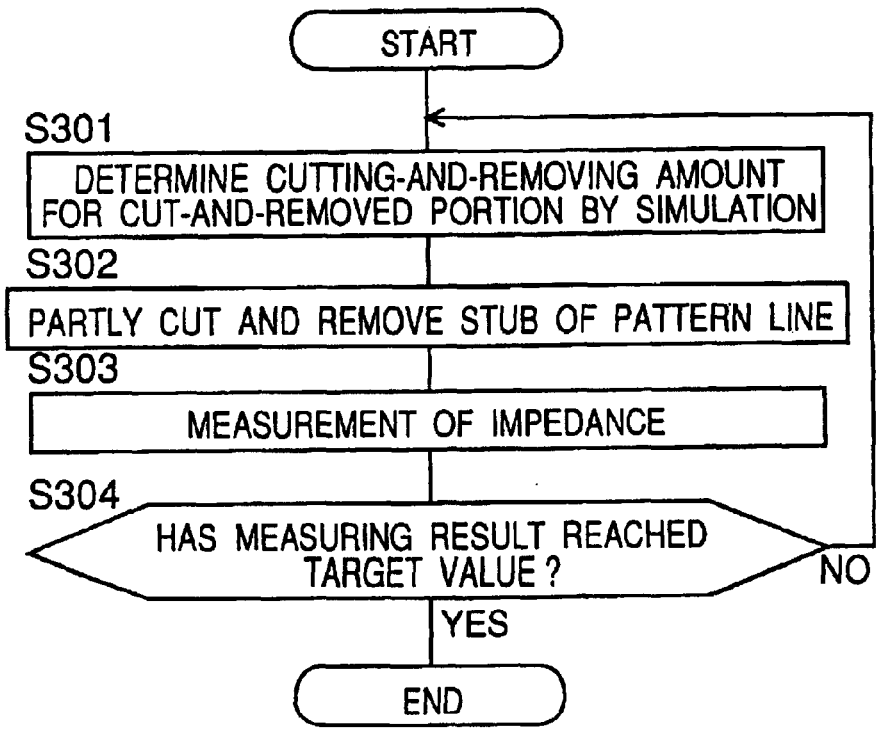
FIG. 4 is a flowchart showing the impedance adjusting method according to the first embodiment of the present invention.

Next, as shown in FIG. 4, at step S301, based on the relational information between the cutting-out amount for the first or second cut-out portion 221 or 222 or the like or the cutting-and-removing amount for the auxiliary cut-and-removed portion 250 or the combined amounts of those amounts, stored in the storage section 201 and the impedance of the input matching circuit 2, the cutting-out amount for the first or second cut-out portion 221 or 222 or the cutting-and-removing amount for the auxiliary cut-and-removed portion 250 or the combined amounts of these amounts for adjusting the impedance of the input matching circuit 2 to a target value is determined by the operating section 202 by simulation or by comparison operation of an impedance measured value with the information stored in the database. Although two cut-out portions, the first and second cut-out portions 221 and 222, are referred to in this example, the number of cut-out portions may be arbitrarily one or three or more arbitrary one without being limited to two.

Next, at step S302, based on the cutting-out amount for the first or second cut-out portion 221 or 222 or the like or the cutting-and-removing amount for the auxiliary cut-and-removed portion 250 or the combined amounts of those amounts determined by the operating section 202 through the simulation or the comparison operation of the impedance measured value with the information stored in the database, the stub 224 of the pattern line 23 is irradiated with a laser beam by the laser irradiation device 203 so that the stub 224 of the pattern line 23 is partly cut out with the laser beam to thereby form the first or second cut-out portion 221 or 222 or the like, or the stub 224 of the pattern line 23 is cut and removed to thereby form the auxiliary cut-and-removed portion 250, or the stub 224 of the pattern line 23 is cut out and moreover cut and removed to thereby form the first or second cut-out portion 221 or 222 or the like and the auxiliary cut-and-removed portion 250.

Next, at step S303, the impedance of the input matching circuit 2 is measured by the measuring instrument 30.

Next, at step S304, the measurement result and the target value are compared with each other by the operating section 202 to decide whether or not the impedance has been reached the target value. More specifically, in the comparison between the measured value and the target value by the operating section 202, if the two values have a difference therebetween within the permissible range or tolerance or have coincided with each other, then the impedance adjustment work is ended. On the other hand, if the two values have a difference therebetween more than the permissible range or tolerance, then the program returns to the step S301, where the simulation or the comparison operation of an impedance measured value with the information stored in the database is done again based on the difference by the operating section 202 at the step S301, by which a new cutting-out amount for the cut-out portion or new cutting-and-removing amount for the auxiliary cut-and-removed portion 250 or new cutting-out amount and cutting-and-removing amount are determined.

In the case where a new cutting-out amount for the cut-out portion or new cutting-and-removing amount for the auxiliary cut-and-removed portion 250 or new cutting-out amount and cutting-and-removing amount have been determined at step S301, the stub 224 of the pattern line 23 is irradiated with a laser beam by the laser irradiation device 203 based on the determined amount(s) at step S302 so that the stub 224 of the pattern line 23 is partly cut out or cut and removed or cut-out and cut and removed with the laser beam, thereby forming the cut-out portion or the auxiliary cut-and-removed portions 250 or both of them, and thereafter the impedance of the input matching circuit 2 is measured again by the measuring instrument 30 at step S303. Then, at step S304, the measured value and the target value are compared with each other by the operating section 202 to decide whether or not the impedance has been reached the target value. Operation like this is performed until the difference between the measured value and the target value comes into the permissible tolerance range or until the measured value coincides with the target value. Whether the operation is done until the difference between the measured value and the target value comes into the permissible tolerance range or until the measured value coincides with the target value is selected as appropriate depending on the precision of adjustment.

An example of the cutting-out or cutting-and-removing process includes the steps of first forming a first cut-out portion 221, subsequently forming a second cut-out portion 222, and subsequently forming an auxiliary cut-and-removed portion. Another example includes the steps of forming a first cut-out portion 221, and subsequently forming auxiliary cut-and-removed portion. In this case, even if an impedance excessively smaller than a desired value results because of an excessive cut-out, the formation of the auxiliary cut-and-removed portion allows the stub to be apparently longer so that the impedance can be increased.

In this way, the impedance adjustment of the input matching circuit 2 is achieved. Impedance adjustment of the output matching circuit 3 can also be achieved in a similar manner.

Now, the relationship between the cutting-and-removing depth of the auxiliary cut-and-removed portions 250 along the thicknesswise of the stub 224 of the pattern line 23, and the impedance, is explained.

Figure 5B:
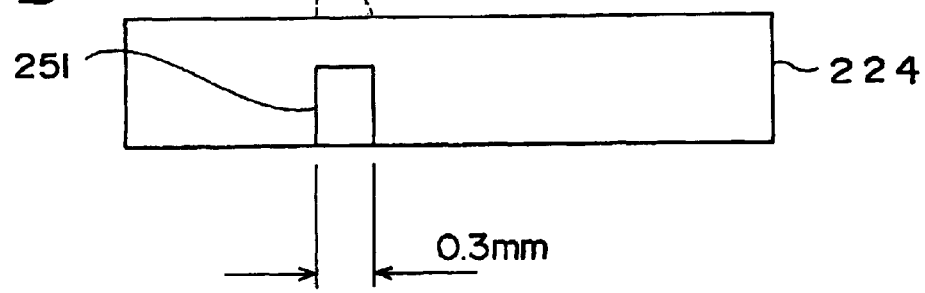

The electrical wavelength is inversely proportional to the square root of the dielectric constant. For example, whereas the wavelength of 1 GHz in the air (its dielectric constant=1) is 300 mm (because of its identicalness with the velocity of light), the wavelength of 1 GHz in the circuit pattern of a ceramic board (with effective dielectric constant here assumed to be 9) of the stub 224 of the pattern line 23 results in 300÷√9=100 (mm) because the square root of the dielectric constant is 3. Accordingly, the auxiliary cut-and-removed portion 250 present on the stub 224 of the pattern line 23 having an effective dielectric constant of 9 is capable of obtaining a maximum of a three times larger distance by partly removing the base board of the stub 224 of the pattern line 23, which is a dielectric. For example, whereas the auxiliary cut-and-removed portion 250 has a width of 0.1 mm in FIG. 5A, partly removing the base board of the stub 224 of the pattern line 23 allows the auxiliary cut-and-removed portions 250 to be equivalent to an auxiliary cut-and-removed portion 251 having a maximum width of 0.3 mm as shown in FIG. 5B.

As shown above, changing the cutting depth of the auxiliary cut-and-removed portion 250 along the thicknesswise direction of the stub 224 of the pattern line 23 causes the phase in the Smith chart to be changed, and besides, for example, one linear slit allows the phase to be shifted by four degrees. This is explained in detail below.

Figure 7:
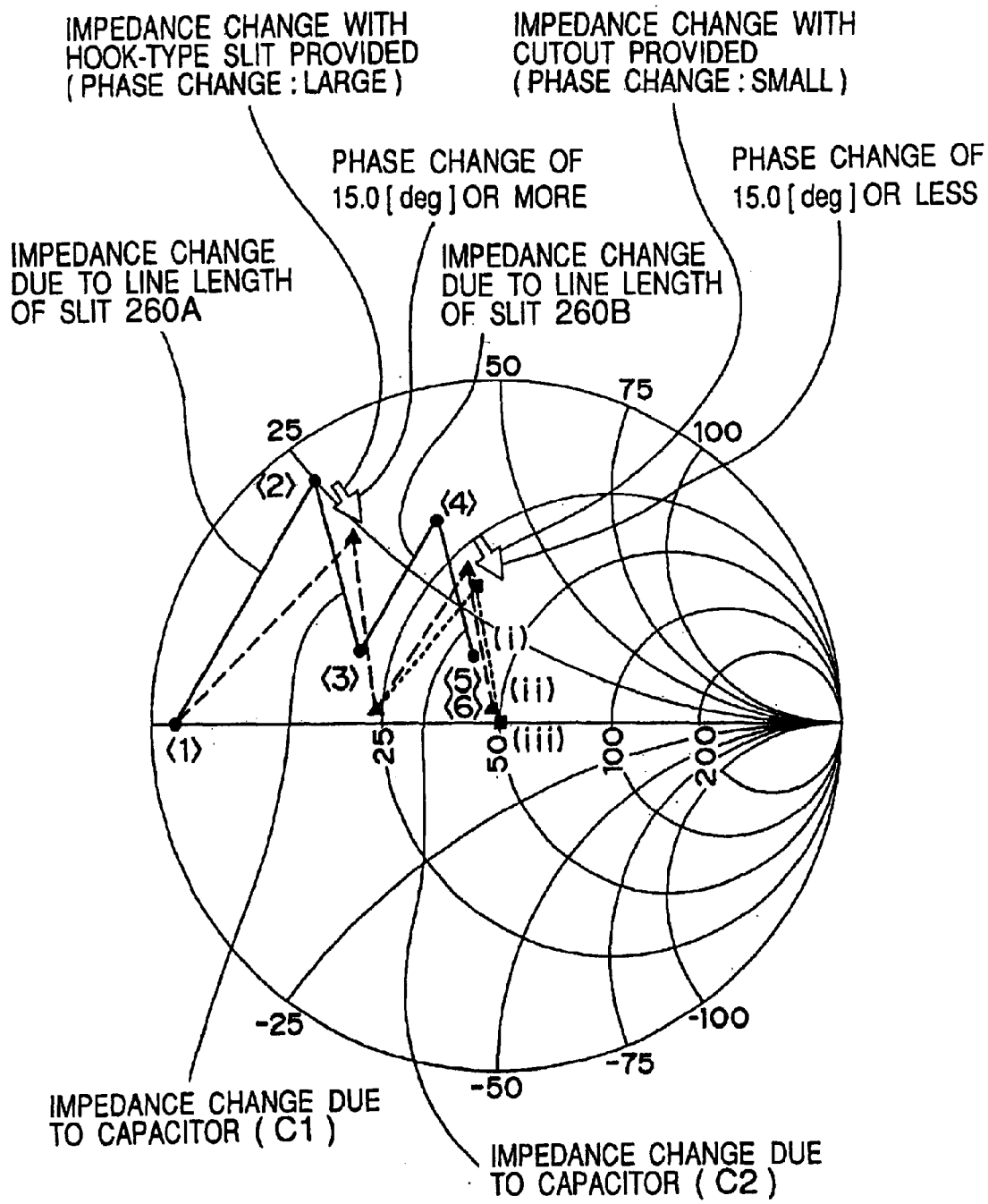
FIG. 7 is a Smith chart for explaining the impedance adjustment by the above impedance adjusting method.

As shown in FIG. 7, the Smith chart is a chart in which impedances are plotted in a circular form, where the center represents 50 Ω, the right end represents an infinity of impedance, the left end represents an impedance of 0 Ω, and the up and down directions represent+(positive) and –(negative), respectively, in imaginary components of impedance.

Figure 6A:
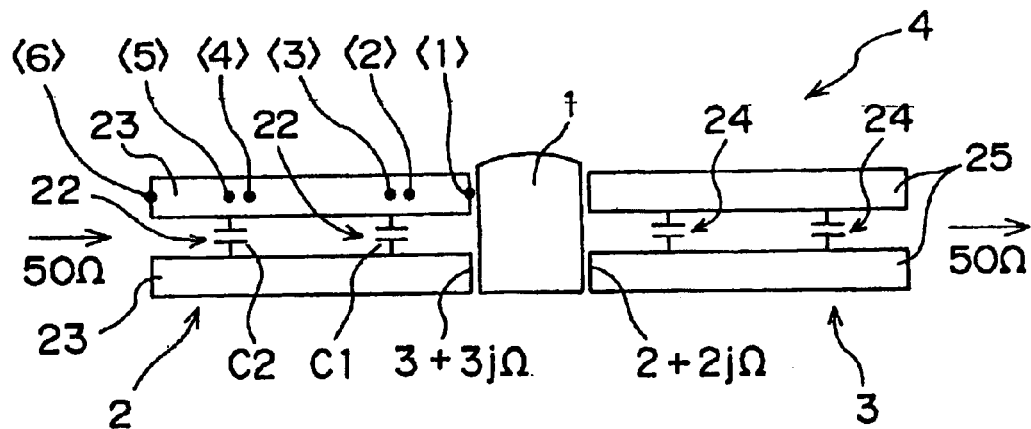
FIGS. 6A and 6B are an explanatory view showing in detail input and output matching circuits for the power amplifier circuit of FIG. 1 to which the above impedance adjusting method can be applied, and a Smith chart showing positions corresponding to the positions of the input matching circuit, respectively.
Figure 6B:
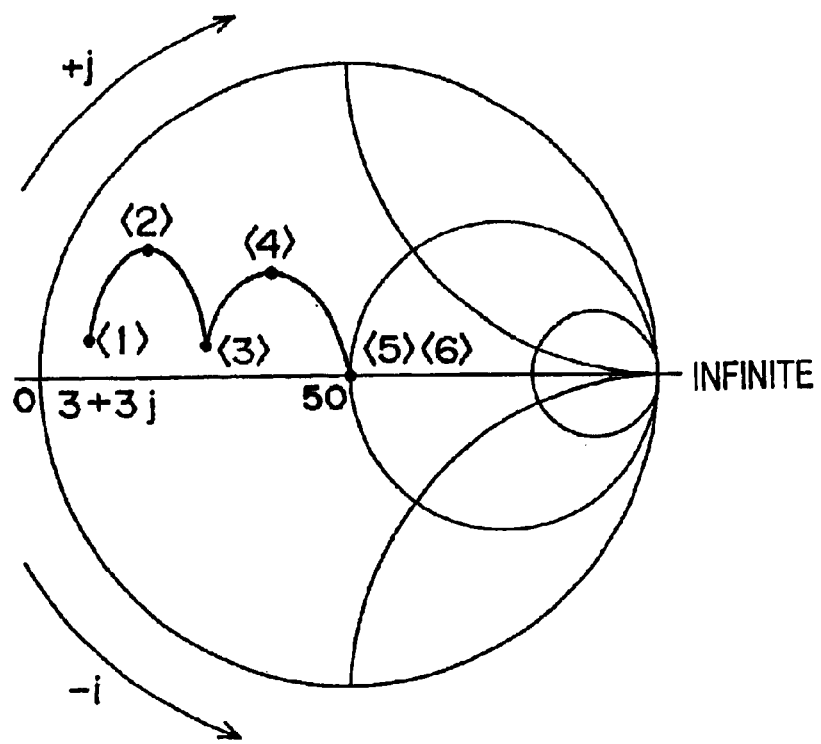

In the Smith chart of FIG. 7, the base point is given by the input impedance of a transistor Tr of an amplifying device 1, for example, 5 Ω (point <1> in FIGS. 6A, 6B and FIG. 7). In correspondence to changes of the line length in the formation of a slit 260A at the pattern-line side base end portion of the stub 224 of the pattern line 23 of FIG. 7, the impedance moves to a point <2> of FIG. 7 on the Smith chart. The point <2> of FIG. 7 corresponds to the position of the point <2> of FIGS. 6A and 6B.

Such changes of impedance due to the line length of the stub 224 of the pattern line 23 on the Smith chart are as follows.

In the case where the normalized impedance of the Smith chart is 50 Ω (i.e., the center is set at 50 Ω) and the impedance of the stub 224 of the pattern line 23 is also 50 Ω, the impedance rotates clockwise (rightward) concentrically about the center of the Smith chart with increasing line length of the stub 224 of the pattern line 23. The angle of the rotation is 360 degrees for a half wavelength of the signal frequency. With a signal of 1 GHz, since one wavelength is 300 mm due to the velocity of light in the air, the impedance rotates one round at 150 mm. In the case where the stub 224 of the pattern line 23 is given by a ceramic board (dielectric) having an effective dielectric constant of 9, the wavelength results in a value obtained by dividing by the square root of the dielectric constant, i.e., results in 50 mm obtained by dividing 150 mm by 3, so that the impedance rotates one round at 50 mm. With a signal of 10 GHz, the wavelength reduces to one tenth so that the impedance rotates one round at 5 mm.

Next, installing a first capacitor C1 as described below out of the two capacitors 22, i.e. the first capacitor C1 and a second capacitor C2, causes the impedance to move from the point <2> to the point <3> in the Smith chart.

Changes of impedance due to the first capacitor C1 on the Smith chart are as follows.

Due to the first capacitor C1, the impedance moves clockwise along a circle which has the center on the horizontal line of the Smith chart and passes through the left-end point and a move-source point. The extent of move, i.e., the variation amount of impedance depends on the constant of the first capacitor C1 and the signal frequency. A smaller constant results in a smaller move extent, and an infinite constant results in a convergence to the left end point. A lower frequency also results in a smaller move extent, and a higher frequency results in a larger move extent. In this case also, a convergence to the left end point also results.

The move extent depends also on the original impedance position, and the first capacitor C1 does not purely have capacitor components only, but has reactance components (L component as with coils). Therefore, this cannot be exemplified by general numerical examples, but constants of about 0.1 of to 5 of are often used. Then, the move from the point <2> to the point <3> is implemented by the first capacitor C1 of, for example, 1 of.

Next, due to a change in line length at the point <3> in forming the slit 260B at an end portion of the stub 224 of the pattern line 23 on the opposite side to the pattern-line side base end portion in FIG. 7, the impedance moves from the point <3> to a point <4> on the Smith chart.

Next, as in the first capacitor C1, installing the second capacitor C2 causes the impedance to move from the point <4> to a point <5> in the Smith chart. As a result of this, the impedance is converted from 5 Ω to 50 Ω (center of the Smith chart).

In the above example, as the capacitors 22, the two capacitors, i.e. the first capacitor C1 and the second capacitor C2, are mounted on a pair of pattern lines 23, 23 and the impedance conversion is performed two times for the following reason. That is, whereas the above example is an adjustment example at the center frequency, necessary frequencies generally have a band width. For the broadening of the width of the frequency band, it is known that using a plurality of capacitors and doing the impedance conversion in small quantities allows a wider frequency band to be taken. Therefore, in this example, with the two capacitors 22 mounted, the conversion is performed divisionally in two operations.

Next described is an impedance adjusting method for the input matching circuit 2 by changing the cutting-and-removing shape of the auxiliary cut-and-removed portions 250 in the stub 224 of the pattern line 23.

Figure 9:
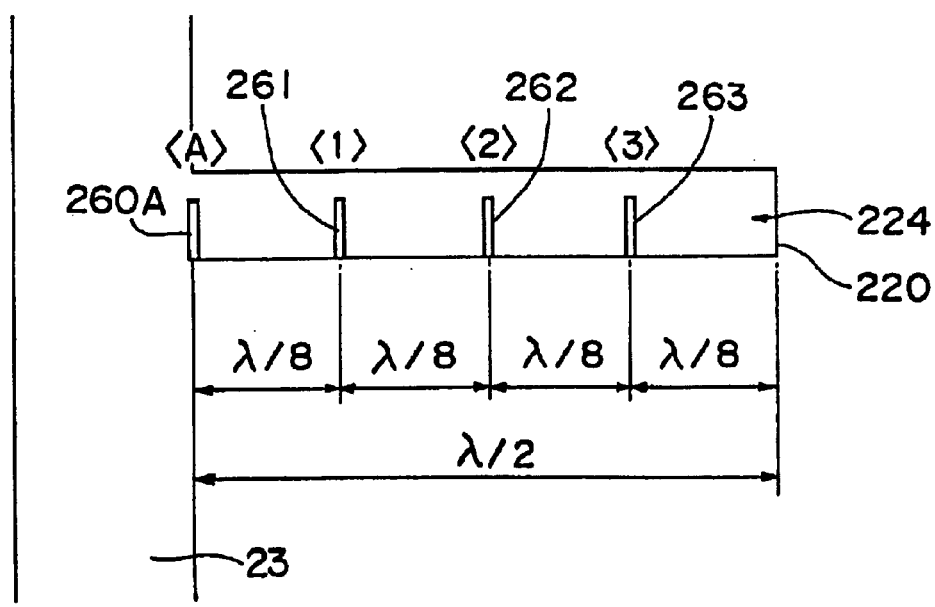
FIG. 9 is an explanatory view for explaining slit positions in the stub in a pattern line in which the linear slits are formed in the impedance adjusting method.
Figure 10:
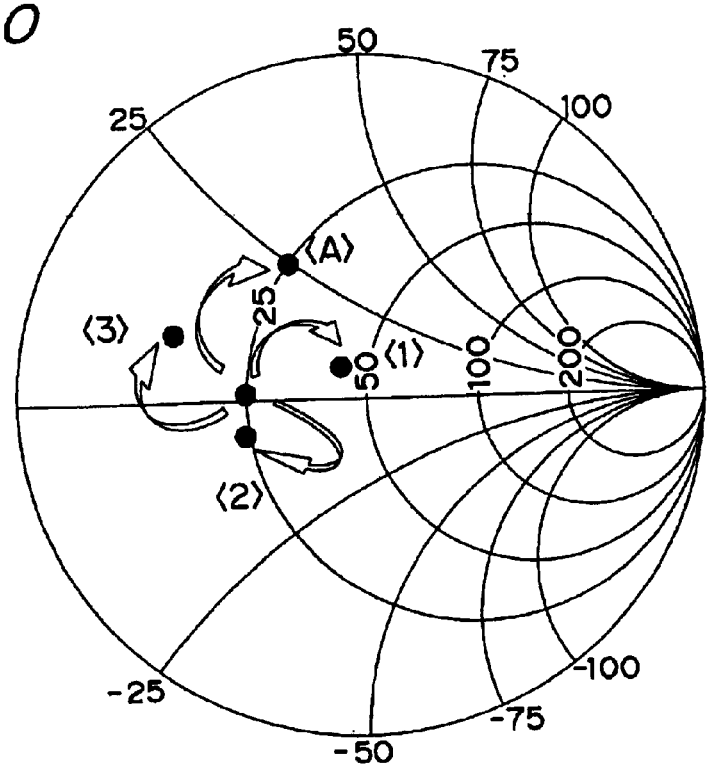
FIG. 10 is a Smith chart for explaining the change of impedance in a case where linear slits are individually formed as in FIG. 9.

(1) A method in which linear slits are formed as a first example of the auxiliary cut-and-removed portions 250 (see FIG. 8):

First, the move of impedance resulting from forming linear slits 260 widthwise in the stub 224 of a λ/2 pattern line 23 as in FIG. 9 is shown in a Smith chart of FIG. 10.

Referring to FIG. 9, when a slit 261 is inserted at a position <1> of the stub 224 of the pattern line 23, the impedance moves toward <1> of the Smith chart of FIG. 10. When a slit 262 is inserted at a position <2> of the stub 224 of the pattern line 23, the impedance moves toward <2> of the Smith chart of FIG. 10. When a slit 263 is inserted at a position <3> of the stub 224 of the pattern line 23, the impedance moves toward <3> of the Smith chart of FIG. 10. It is noted that because forming only one slit 260 yields too small a move extent on the Smith chart, it is preferable to form three or more slits 260 and, desirably, in a staggered form.

Figure 11:
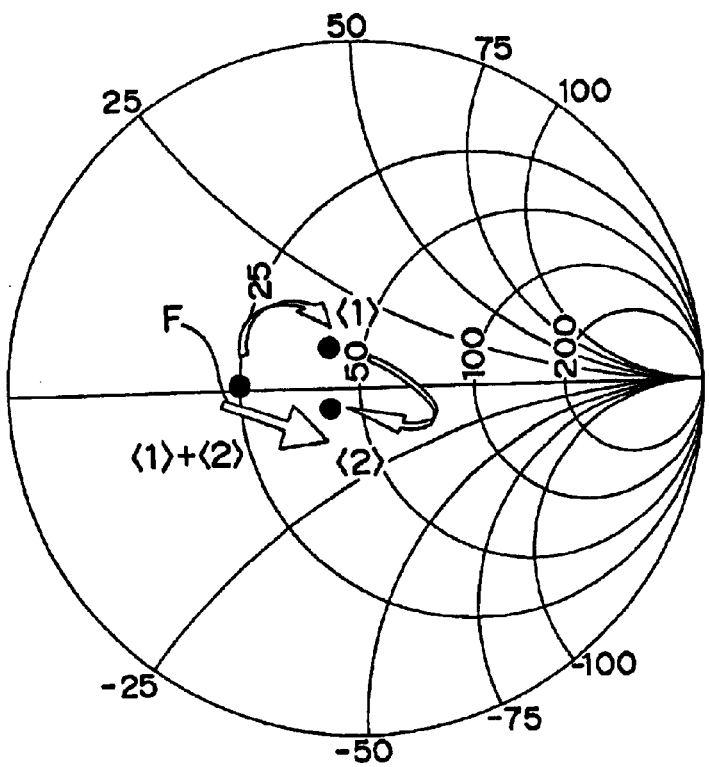
FIG. 11 is a Smith chart for explaining the change of impedance in a case where a plurality of linear slits out of the linear slits of FIG. 9 are combined together.

When slits are combined, for example, when the slit 261 of <1> position and the slit 262 of <2> position are combined, the impedance moves toward a direction F, which is a vector sum of the direction moving toward <1> and the direction moving toward <2>, along which the impedances move, respectively, as shown in the Smith chart of FIG. 11. It is noted that reference character <A> in the Smith chart of FIG. 10 denotes a direction of impedance resulting when the slit 260A is formed at a position corresponding to a λ/2 pattern length of the stub 224 of the pattern line 23.

Figure 12:
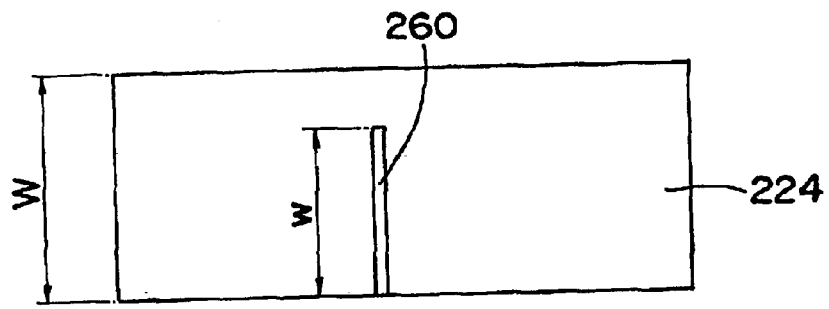
FIG. 12 is an explanatory view for explaining the relationship between the length of a linear slit and the phase of impedance.

Next, with respect to the length of the slit 260, when a slit 260 having a length w is formed in the stub 224 of the pattern line 23 having a width W as shown in FIG. 12, there can be seen phase changes shown in Table 1:

TABLE 1

Relationship between linear slit and phase

| Slit length W | (½) W | (⅘) W |
|---|---|---|
| Phase (deg.) | 1–2 | 3–5 |

Figure 13:
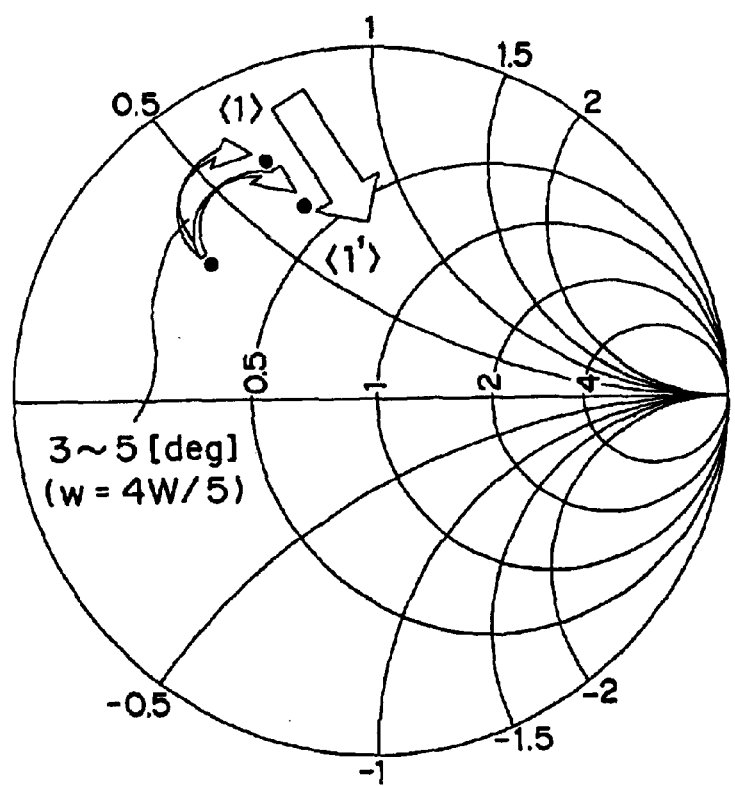
FIG. 13 is a Smith chart for explaining the change of impedance in a case where the linear slit is formed as in FIG. 12.

That is, moves (changes) of impedance as shown in the Smith chart of FIG. 13 can be seen.

As the number of slits 260 is increased, the phase also increases proportionally to the number of slits 260. That is, it holds that ("phase change"="phase change of one slit"× "number of slits").

Now, a case in which the slits 260 are used for impedance adjustment is explained in detail.

Figure 14:
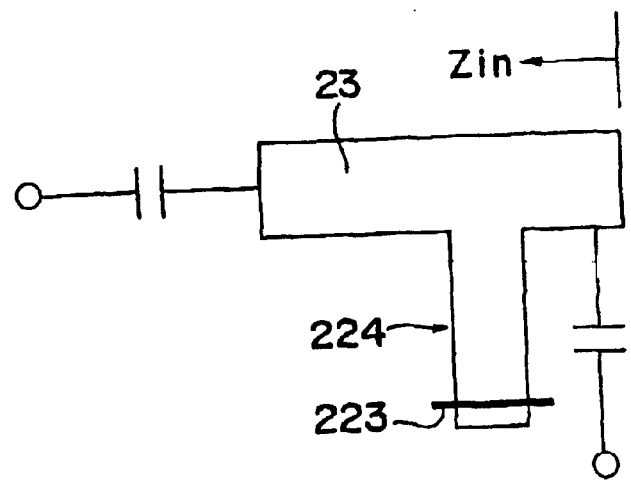
FIG. 14 is an explanatory view for explaining impedance adjustment with a linear slit.
Figure 15:
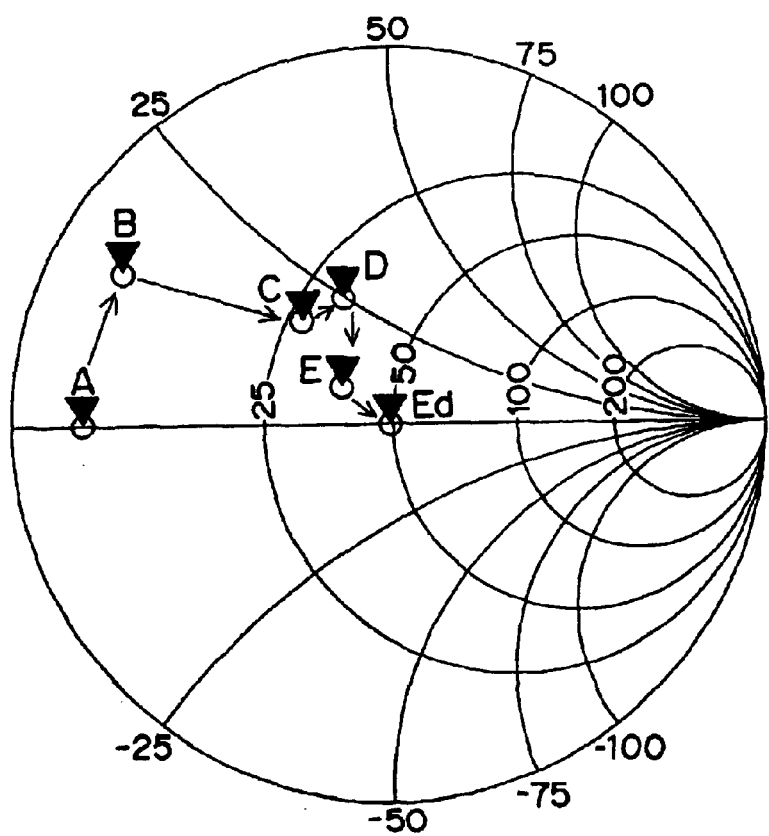
FIG. 15 is a Smith chart for explaining the change of impedance in a case where the linear slit is formed as in FIG. 14.

With the use of a matching circuit 2 as shown in FIG. 14, when an impedance Zin is moved to a point B (50 Ω) of a Smith chart of FIG. 15 depending on a 50 Ω pattern line 23 and the mounting positions of the capacitors onto the pattern line 23, the impedance of the amplifying device 1 is assumed to be $$Z=5+j0 \ \Omega(\text{point A in FIG. 15}) \quad (\text{Eq. 1}).$$

The impedance resulting from providing a 50 Ω pattern line 23 of an appropriate pattern line length in the above case is assumed to be $$Zin1=5.4+j13.3 \ \Omega(\text{point B in FIG. 15}) \quad (\text{Eq. 2}).$$

Next, providing capacitors in parallel results in $$Zin2=27.3+j17.2 \ \Omega(\text{point C in FIG. 15}) \quad (\text{Eq. 3}).$$

The impedance resulting from providing a 50 Ω pattern line 23 of an appropriate pattern line length in the above case is assumed to be $$Zin3=31.6+j24.4 \ \Omega(\text{point D in FIG. 15}) \quad (\text{Eq. 4}).$$

Next, when the stub 224 is provided onto the 50 Ω pattern line 23 of the appropriate pattern line length, the impedance moves to $$Zin4=38+j24.4 \ \Omega(\text{point E in FIG. 15}) \quad (\text{Eq. 5}),$$

but this cannot afford to take matching with the target impedance 50 Ω. Therefore, cutting the stub 224 along a shortening direction 23 so that the length of the stub 224 is reduced by about 10 deg. causes the point E on the Smith chart to move to $$Zin1'=50+j0 \ \Omega(\text{point Ed in FIG. 15}) \quad (\text{Eq. 6}).$$

That is, the matching to the impedance 50 Ω, which is the target point, has been achieved.

Figure 16:
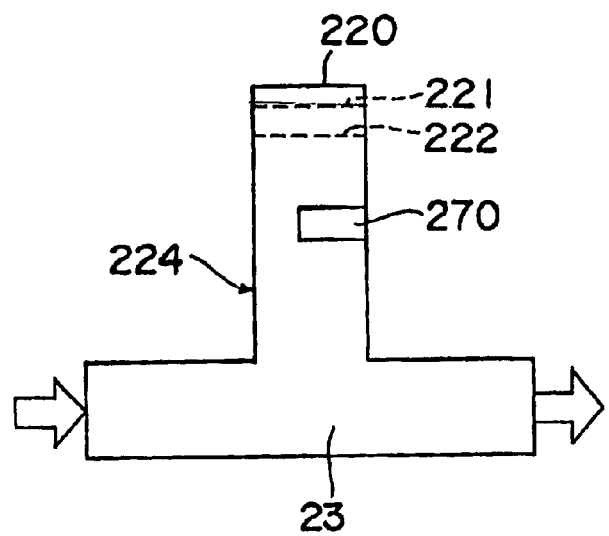
FIG. 16 is an explanatory view of a stub in a pattern line in which a cut-out is formed in the impedance adjusting method.

(2) A method in which a cut-out is formed as a second example of the auxiliary cut-and-removed portions 250 (see FIG. 16)

Figure 17:
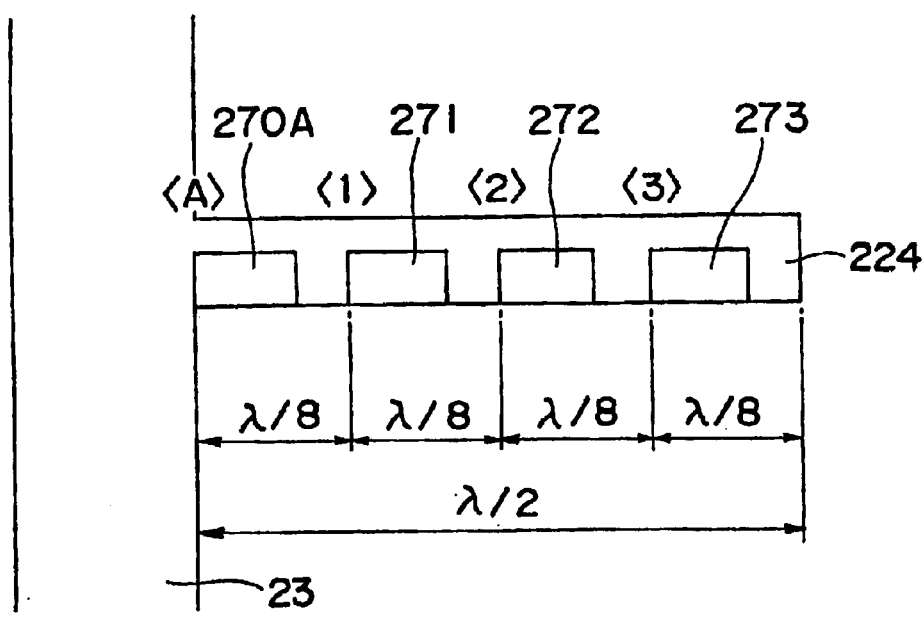
FIG. 17 is an explanatory view for explaining the cut-out position in the stub of a pattern line in which cutouts are formed in the impedance adjusting method.
Figure 18:
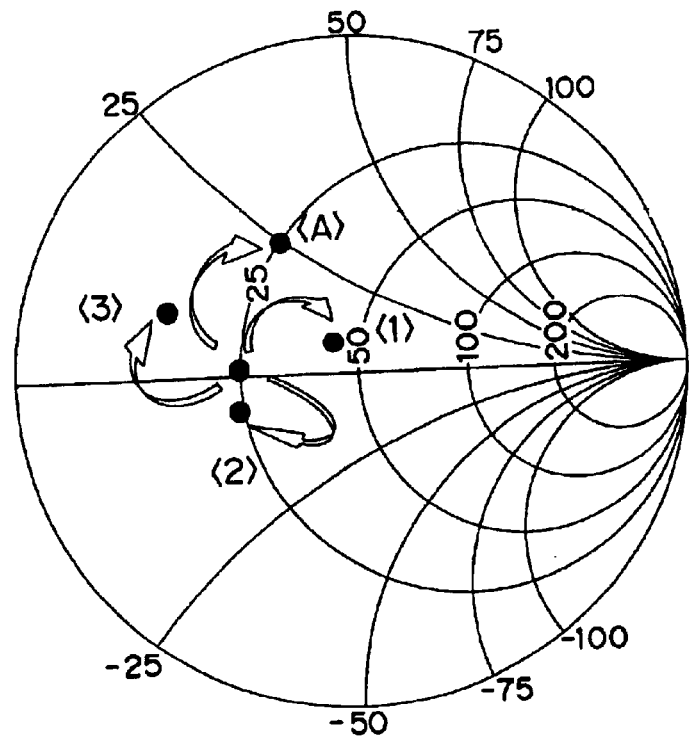
FIG. 18 is a Smith chart for explaining the change of impedance in a case where the cut-outs are individually formed as in FIG. 9.
Figure 19:
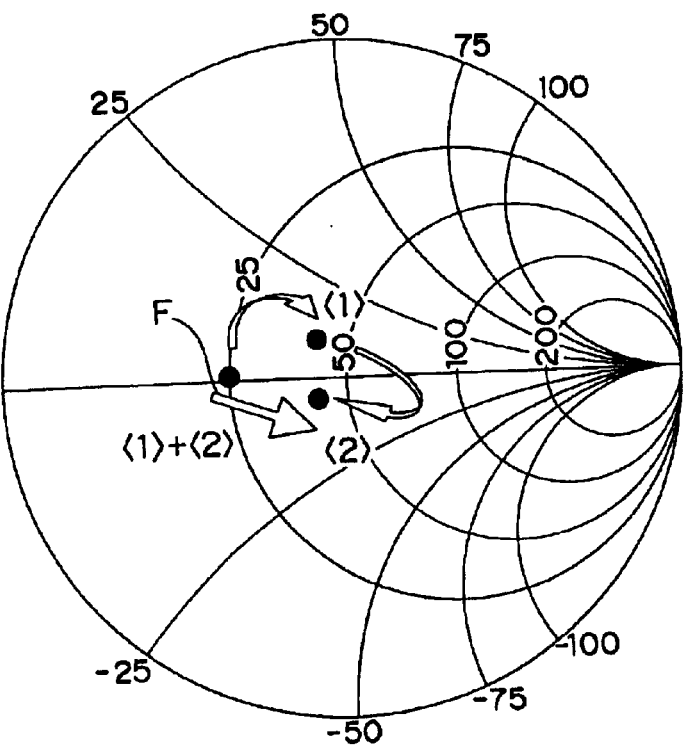
FIG. 19 is a Smith chart for explaining the change of impedance in a case where a plurality of cut-outs out of the cut-outs of FIG. 9 are combined together.

First, a move of impedance resulting from forming a surface cut, i.e. a cut-out 270, in the stub 224 of a λ/2 pattern line 23 as shown in FIG. 17 is shown in FIG. 18. When a cut-out 71 is formed at a position <1> of the stub 224 of the pattern line 23, the impedance moves toward <1> of the Smith chart of FIG. 18. When a cut-out 72 is formed at a position <2> of the stub 224 of the pattern line 23, the impedance moves toward <2> of the Smith chart of FIG. 18. When a cut-out 73 is formed at a position <3> of the stub 224 of the pattern line 23, the impedance moves toward <3> of the Smith chart of FIG. 18. Further, when the cut-outs 270 are combined, for example, when the cut-outs 71 and 72 of <1> and <2> of the Smith chart are combined, the impedance moves toward a direction F, which is a vector sum of the direction moving toward <1> and the direction moving toward <2>, along which the impedances move, respectively, as shown in FIG. 19. It is noted that reference character <A> in the Smith chart of FIG. 18 denotes a direction of impedance resulting when the slit 270A is formed at a position corresponding to a λ/2 pattern length of the stub 224 of the pattern line 23.

Figure 20:
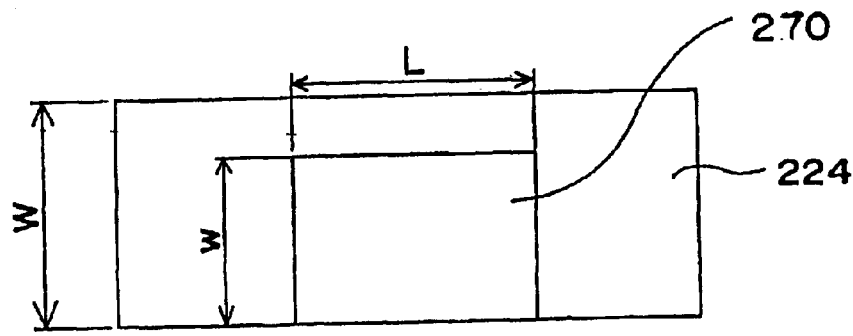
FIG. 20 is an explanatory view of a stub in a pattern line in which a cut-out is formed in the impedance adjusting method.

Next, with respect to the width and length of the cut-out 270, when the slit 270 having a width w and a length L is formed in the stub 224 of the pattern line 23 having a width w as shown in FIG. 20, the width w shows a value similarly to that of the slit 260, but there can be seen phase changes shown in Table 2 as the length L of the cut-out 270 is increased:

TABLE 2

Relationship between cut-out length and phase

| Cut-out width W | (½) W | (⅘) W |
|---|---|---|
| Increment of phase/increment of cut-out length (deg/0.1 mm) | 0.05 to 0.15 | 0.15 to 0.35 |

Figure 21:
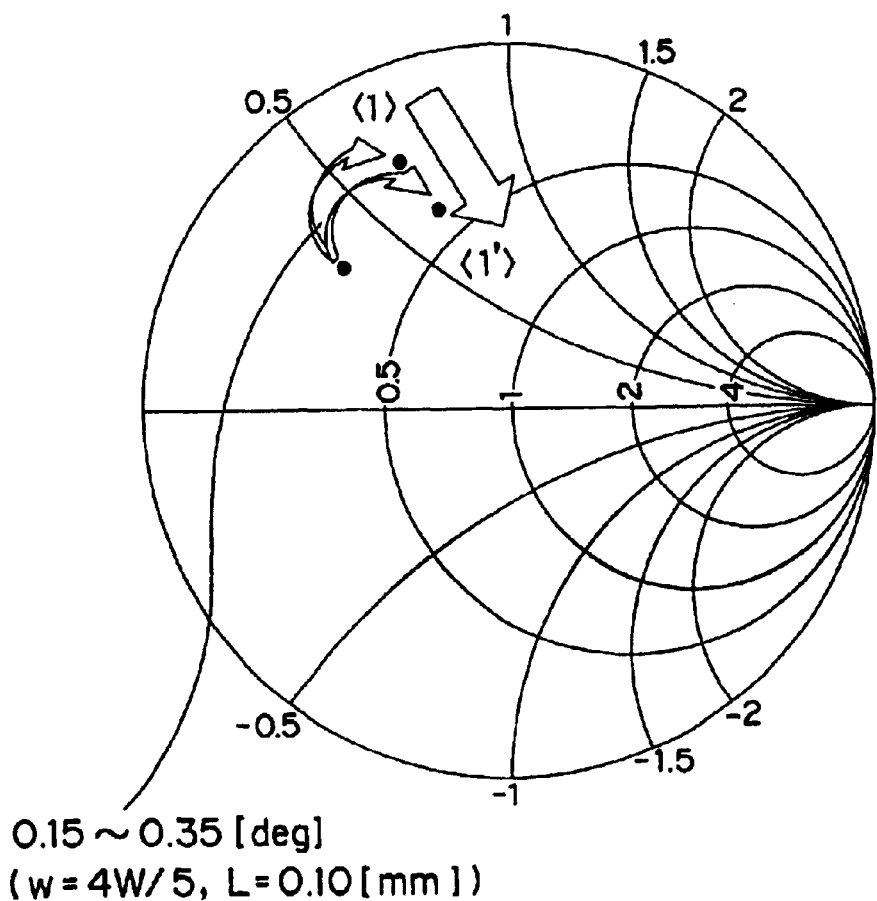
FIG. 21 is a Smith chart for explaining the change of impedance in a case where the cut-out is formed as in FIG. 20.

That is, moves of impedance as shown in the Smith chart of FIG. 21 can be seen.

As the cut-out length L is increased, the phase variation amount also increases proportionally. That is, it holds that phase change={phase change of one slit (3 to 5 (deg.) for w=4W/5)}+{increment of cut-out}×{phase variation amount (0.15 to 0.35 (deg./0.1 mm) for w=4W/5)}.

The length variation amount of the cut-out 270 is a infinitesimal one, as compared with cases in which a plurality of slits 260 are formed in the stub 224 of the pattern line 23. The impedance adjusting method with the use of the cut-out 270 is similar to the impedance adjusting method for the formation of the slit 260, except that the phase change becomes infinitesimal.

(3) A method in which hook-type slits are formed as a third example of the auxiliary cut-and-removed portions 250.

Figure 22:
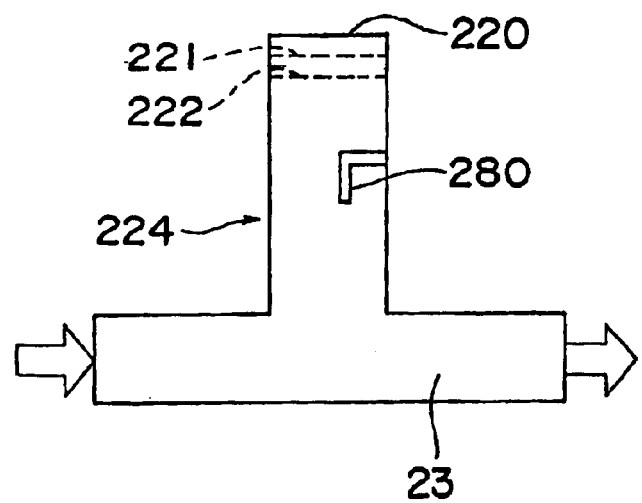
FIG. 22 is an explanatory view of a stub in a pattern line in which a hook-type slit is formed in the impedance adjusting method.
Figure 23:
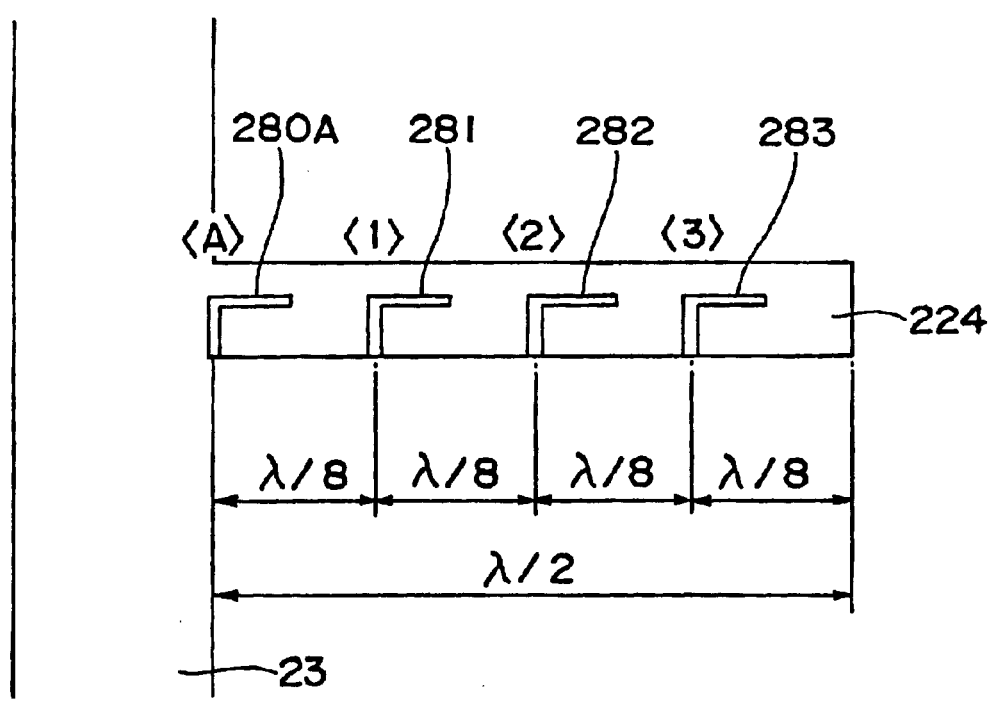
FIG. 23 is an explanatory view for explaining hook-type slits positions in a stub in a pattern line in which hook-type slits are formed in the impedance adjusting method.
Figure 24:
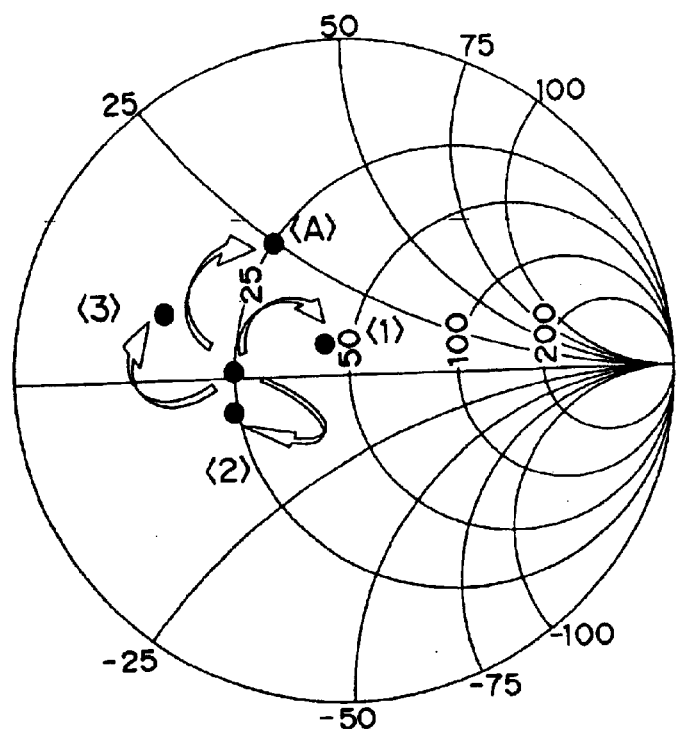
FIG. 24 is a Smith chart for explaining the change of impedance in a case where the hook-type slit is individually formed as in FIG. 22.
Figure 25:
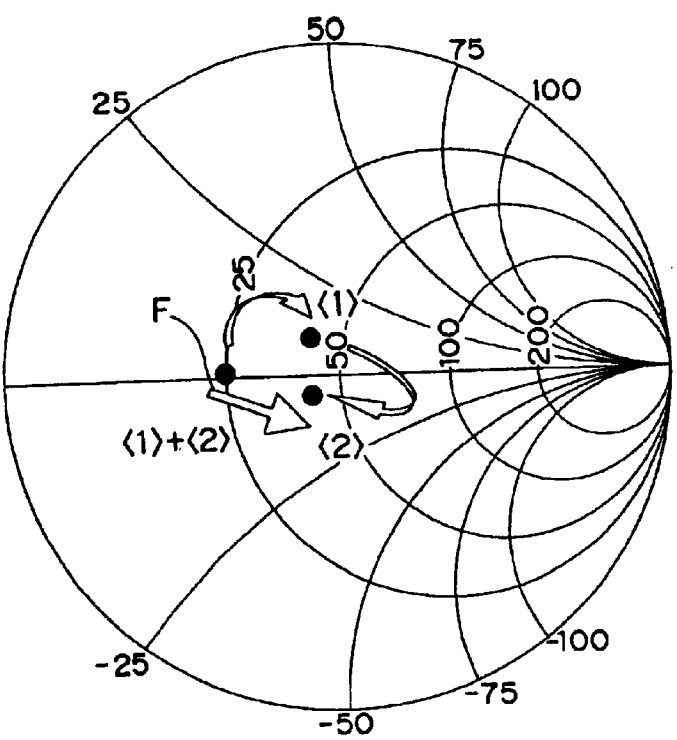
FIG. 25 is a Smith chart for explaining the change of impedance in a case where a plurality of hook-type slits out of the hook-type slits of FIG. 23 are combined together.

First, a move of impedance resulting from forming a hook-type slit 280 in the stub 224 of a λ/2 pattern line 23 as shown in FIG. 22 is shown in FIG. 23. When a hook-type slit 281 is formed at a position <1> of the stub 224 of the pattern line 23, the impedance moves toward <1> of the Smith chart of FIG. 24. When a hook-type slit 82 is formed at a position <2> of the stub 224 of the pattern line 23, the impedance moves toward <2> of the Smith chart of FIG. 24. When a hook-type slit 283 is formed at a position <3> of the stub 224 of the pattern line 23, the impedance moves toward <3> of the Smith chart of FIG. 24. Further, when the hook-type slits 280 are combined, for example, when the hook-type slits 281 and 282 of <1> and <2> are combined, impedance moves toward a direction F, which is a vector sum of the direction moving toward <1> and the direction moving toward <2>, along which the impedances move, respectively, as shown in FIG. 25. It is noted that reference character <A> in FIG. 24 denotes a direction of impedance resulting when a hook-type slit 280A is formed at a position corresponding to a λ/2 pattern length of the pattern line 23.

Figure 26:
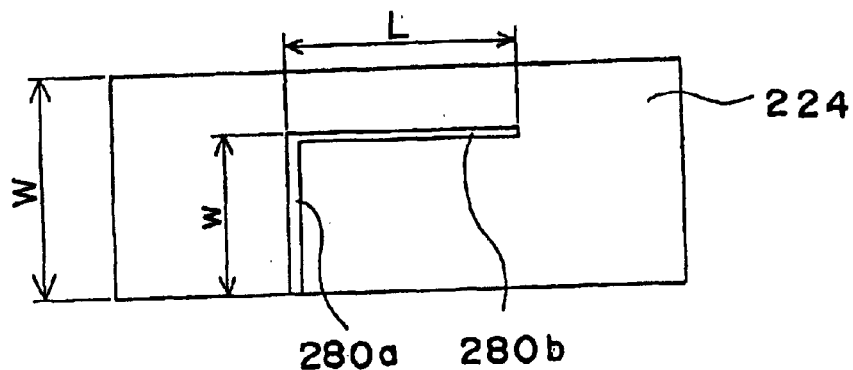
FIG. 26 is an explanatory view for explaining the relationship between the length of a hook-type slit and the phase of impedance.

Next, with respect to the width (slit 280A) and length (slit 280B) of the hook-type slit 280, when a hook-type slit 280, when a hook-type slit 280 having a width w (slit 280A) and a length L (slit 280B) is formed in the stub 224 of the pattern line 23 having a width W as shown in FIG. 26, the width w shows a value similarly to that of the linear slit 260, but there can be seen phase changes shown in Table 3 as the length L (slit 280B) is increased:

TABLE 3

| slit A width W | (½) W | (⅘) W |
|---|---|---|
| Phase increment/ increment of hook-type slit length (deg/mm) | 4.0 to 6.0 | 12.0 to 15.0 |

Figure 27:
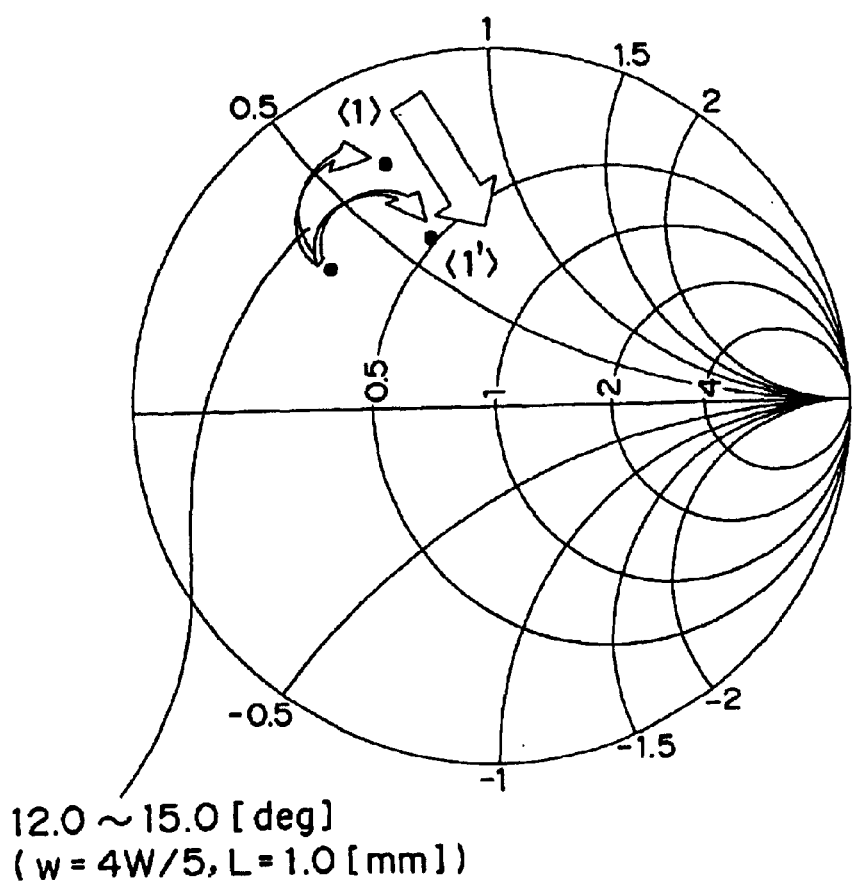
FIG. 27 is a Smith chart for explaining the change of impedance in a case where the hook-type slit is formed as in FIG. 26.

That is, moves of impedance as shown in the Smith chart of FIG. 27 can be seen.

As the length L (slit B) is increased, the phase variation amount also increases proportionally. That is, it holds that phase change={variation amount of one slit (3 to 5 (deg.) for w=4W/5)}+{increment of length L}×{phase variation amount (12.0 to 15.0 (deg./mm) for w=4W/5)}. The variation amount of the length of the hook-type slit 280 is a relatively large variation amount, as compared with cases in which a plurality of slits 260 are formed in the stub 224 of the pattern line 23.

The impedance adjusting method with the use of hook-type slits is similar to the impedance adjusting method for the formation of the slit 260, except that the phase change becomes larger.

Figure 28:
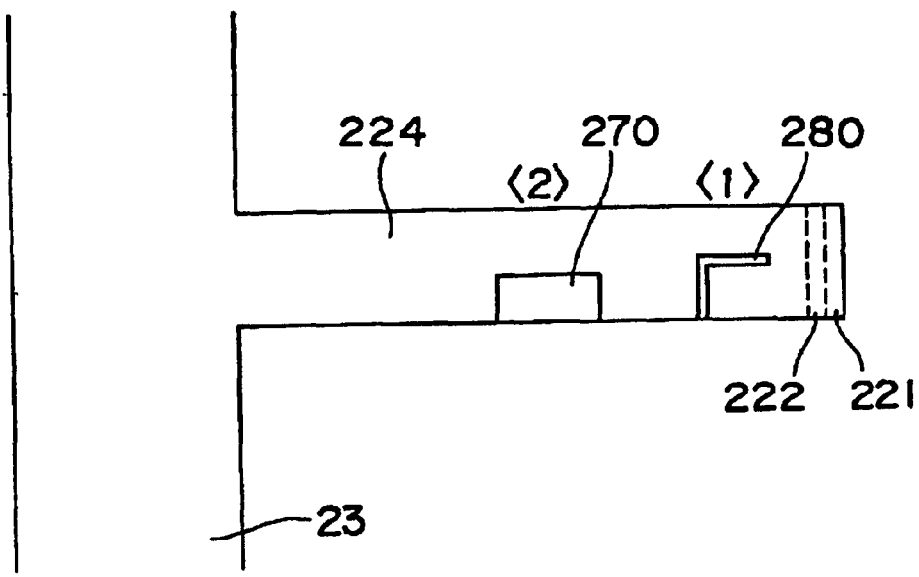
FIG. 28 is an explanatory view for explaining a slit position and a cut-out position in a stub in a pattern line in which a linear slit and a cut-out are formed in combination in the impedance adjusting method.

(4) A linear slit 260, a cut-out 270, and a hook-type slit 280 are combined as a fourth example of the auxiliary cut-and-removed portions 250 (See FIG. 28)

A matching-circuit impedance adjusting method for the case in which a linear slit 260, a cut-out 270, and a hook-type slit 280 are combined is as follows.

Respective characteristics of the linear slit 260, the cut-out 270, and the hook-type slit 280 differ from one another in phase variation amount, the magnitudes of which are shown below:

{cut-out (0.15 to 0.35 (deg./0.1 mm))}
<{linear slit (3.0 to 5.0 (deg.))}
<{hook-type slit (12.0 to 15.0 (deg./mm))}
where w=4W/5.

With the impedance Z0 of one active device 1 assumed to be $Z0=2+j0$ (Eq. 7), this impedance is to be matched to 50 Ω. In this adjustment, a hook-type slit 280 larger in phase variation amount for use of coarse adjustment (<1> of FIG. 28) and a cut-out 270 smaller in phase variation amount for use of fine adjustment (<2> in FIG. 28) are formed on the matching circuit.

First of all, a case in which none of the hook-type slit 280 and the cut-out 270 are formed in the matching circuit 2 is shown by impedances connected together in solid line in FIG. 7. Then, the hook-type slit <1> is first formed so that the phase is largely rotated. The then resulting impedance is shown in broken line in FIG. 7. Then, the cut-out <2> is next formed so that the impedance is small rotated. The then resulting impedance is shown in dotted line. Thus, the impedance moves from (i) to (ii) to (iii) shown in FIG. 7 so as to be matched to 50 Ω.

According to this first embodiment, when a stub 234 is overcut out in forming the cut-out portions 221, 222 by cutting out end portions of the stub 234 for the purpose of impedance adjustment, the stub 234 can be made apparently (to appear) longer by forming the auxiliary cut-and-removed portion 250 so that the impedance adjustment can be achieved easily with higher precision. For example, forming a slit having a cut-in width of 30 μm and a cut-in length of 1.75 mm in a 50 Ω stub (with a line width of 2.25 mm) under the condition of 2 GHz with a high-frequency simulator or the like causes the phase angle to change 5 degrees or so. This is equivalent to a length increment of 0.5 mm or so of the line length. Accordingly, by taking advantage of this, the stub 234, when cut out too much, can be made apparently longer by forming the slit 260. In contrast to this, in the conventional method, in which indeed a stub is formed but the stub is merely cut out, cutting out the stub too much would cause the matching circuit 2 to be disposed of, thus making it necessary to pay careful attention so that the stub would not be cut out too much by cutting out the stub in steps of infinitesimal degrees and, besides, making the cutting-out work or adjusting work time-consuming. On the other hand, in the first embodiment, even if the stub is cut out too much with the result of an excessively decreased impedance, forming the auxiliary cut-and-removed portions makes it possible to obtain an apparently increased length of the stub and thereby increase the impedance. Therefore, the cutting-out of the stub can be done once again so that the impedance approaches the desired value, and thus the impedance adjustment can be achieved more easily and with higher precision.

Further, based on the cutting-out amount by the laser, the cutting-and-removing amounts by the laser, and the relationships between these individual amounts and the impedance of the input matching circuit 2, the cutting-out amount or the cutting-and-removing amount or the cutting-out amount and the cutting-and-removing amount for adjusting the impedance of the input matching circuit 2 to the target value are determined by simulation or by comparison operation of the impedance measured value with information stored in the database. Then, based on the amount determined by the simulation or by the comparison operation of the impedance measured value with the information stored in the database, the stub 224 of the pattern line 23 is partly cut out, or cut and removed, or cut out and cut and removed, with the laser beam, by which the impedance of the input matching circuit 2 is adjusted to the target value. Accordingly, since this method is other than a method in which the impedance is adjusted to a target value by changing the mounting position of the capacitor 22 on the pattern line 23, the pattern line 23 can be shortened, allowing the mounting space to be reduced and moreover allowing the impedance adjustment to be achieved easily and with high precision. By contrast, in the conventional method, impedance adjustment is done by changing the mounting position of the chip capacitor on the pattern line, making it necessary for the pattern line to have at least such a length that impedance adjustment would be achievable, which inevitably involves lengthening the pattern line, thus resulting in an increased installation space. However, in the first embodiment, without the need for changing the mounting position of the capacitor, the pattern line can be reduced in its length while it is only required to merely partly cut out, or cut and remove, or cut out and cut and remove, the stub 224 of the pattern line 23. Thus, the elimination of the need for changing the mounting position eliminates the need for the mounting-position changing work.

Also, the operating section 22 has an operating function at high frequencies, while the relational information between the cutting-out amount, or the cutting-and-removing amount (or the cutting-out amount and the cutting-and-removing amount as required), of the stub of the pattern line in the matching circuit 2, and the impedance characteristics, is stored in the storage section 201. By so doing, the amounts of the cut-out portions or the positions and amounts of the auxiliary cut-and-removed portions can be determined, while the constant of the capacitor 22 and the move extent of the impedance are predicted by simulation or by comparison operation of impedance measured values with the information stored in the database. Thus, the conventional cut-and-dry method can be replaced, and the impedance adjustment can be achieved faster and with higher precision. As a result of this, for example, characteristic values of the transistor 1 are computed by the operating section 202 based on impedance measured values prior to the formation of the cut-out portion and the auxiliary cut-and-removed portion, and initial characteristic data of the matching circuit 2, and further a cutting-out amount, or a cutting-and-removing amount and a cutting-and-removing position, or a cutting-out amount and a cutting-and-removing amount and a cutting-and-removing position, for the adjustment of impedance to 50Ω are determined. Then, by cutting out to the cutting amount or by cutting and removing to the cutting-and-removing amount at the cutting-and-removing position, the impedance becomes generally 50 Ω, leaving a need for fine adjustment afterward. Thus, the adjustment work can be simplified and shortened in time to a great extent. Besides, with information as to the semiconductor lots of the transistor 1, which is an example of the amplifying device, as well as to the results of the fine adjustment, stored in the storage section 201, and by taking into consideration those pieces of information to perform the simulation or the comparison operation of an impedance measured value with the information stored in the database, the area to which the impedance is narrowed to the target value can be further reduced. Thus, the adjustment time can be further reduced.

Also, the conventional method has involved longer adjustment time because of human adjustment work, as well as variations among workers. On the other hand, since this adjusting apparatus is capable of performing the impedance adjustment almost automatically, the adjustment can be achieved in shorter time and with less variations.

It is noted here that the present invention is not limited to the above embodiment and may be embodied in other various modes.

Figure 29:
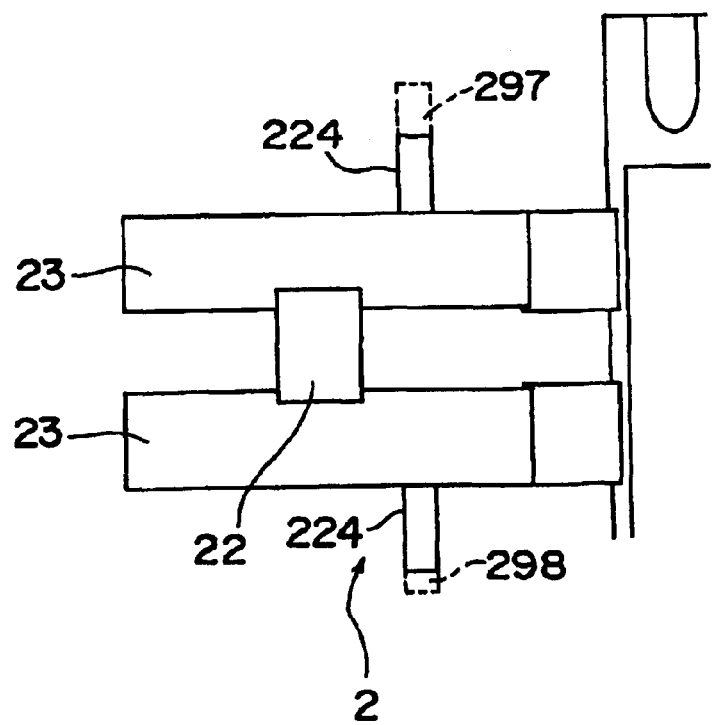
FIG. 29 is an explanatory view for explaining a matching-circuit impedance adjusting method according to a second embodiment of the present invention.

For example, as shown in FIG. 29, as a second embodiment of the present invention, left-and-right cutting-out amounts for stubs 224, 224 of left-and-right pattern lines 23, 23 may be made different from each other, or cutting-and-removing amounts for left-and-right auxiliary cut-and-removed portions 297, 298 may be different from each other, or the cutting-out amounts and the cutting-and-removing amounts may be different from each other. For example, in the stubs 224, 224 of the left-and-right pattern lines 23, 23, the cutting-out amounts for the stubs 224, 224 may be different from each other, or the widthwise lengths or thicknesswise depths of left-and-rights linear slits 260 may be different from each other, or the areas of left-and-right cut-outs 270 may be different from each other, or the widthwise/lengthwise lengths or thicknesswise depths of left-and-right hook-type slits 280 may be different from each other. That is, in the conventional method, impedance adjustment is done only by changing the mounting positions of chip capacitors on the pattern lines and shortening the lengths of stubs, in which case, however, since both of opposite lines are subject to concurrent changes, left-and-right balance could not be attained, disadvantageously. In contrast to this, in the second embodiment of the present invention, for example, by making the left-and-right cutting-out amounts, or cutting-and-removing amounts, or the cutting-out amounts and cutting-and-removing amounts, of the stubs 224, 224 of the left-and-right pattern lines 23, 23 different from each other, it becomes possible to attain the left-and-right balance adjustment, so that input characteristics can be improved.

Also, as shown in FIGS. 30A–30C, as a third embodiment of the present invention, the thicknesswise cutting-and-removing amounts of the stub 224 of the pattern line 23 may be changed. That is, in the conventional method, since impedance adjustment is performed by changing the mounting position of the chip capacitor on the pattern line, impedance characteristics would be affected by variations of physical constants of the dielectric forming the stub 224 of the pattern line, and moreover fine adjustment would be impossible, which leads to an issue of poor impedance characteristics. In contrast to this, in the third embodiment of the present invention, it is possible to perform fine adjustment in accordance with impedance characteristics by changing the thicknesswise cutting-and-removing amount of the stub 224 of the pattern line 23, particularly, its cutting-and-removing depth at a base board 224b under a conductor 224a, for example, to a position 289 deeper than a position 288 in FIG. 30A, the move extent of impedance phase reduces. Therefore, higher-precision adjustment can be achieved, which leads to better impedance characteristics and higher yield. It is noted that reference numeral 224c denotes a grounding portion. Adjustment for the coupling amount of a λ/4 coupled circuit can also be achieved by adjusting the dielectric depth between patterns.

Also, as shown in FIG. 31, as a fourth embodiment of the present invention, it is also possible that, with a recessed portion 290 previously formed along the thicknesswise direction of the stub 224 of the pattern line 23, an insulating resin 291 is buried in the recessed portion 290 and then cut and removed with a laser beam to form an auxiliary cut-and-removed portion 292. That is, in the conventional method, since impedance adjustment is performed by changing the mounting position of the chip capacitor on the pattern line, impedance characteristics would be affected by variations of physical constants of the dielectric forming the stub 224 of the pattern line, and moreover unidirectional fine adjustment for reducing the length alone would be impossible, which leads to an issue of poor impedance characteristics. In contrast to this, in the fourth embodiment of the present invention, with the recessed portion 290 previously formed along the thicknesswise direction of the stub 224 of the pattern line 23, the insulating resin 291 is buried in the recessed portion 290 and then cut and removed with a laser beam to form the auxiliary cut-and-removed portion 292 such as a linear slit 260, a cut-out 270, or a hook-type slit 280. As a result of this, when fine adjustment is desired, it becomes possible to cut and remove the insulating resin 291 to an infinitesimal extent more easily than to cut the stub 224 of the pattern line 23 on a ceramic board or the like to an infinitesimal extent, so that fine adjustment in accordance with impedance characteristics can be achieved, which leads to better impedance characteristics and higher yield. In FIG. 31, the recessed portion 290 has only to be formed at least at the conductor part 224a of the stub 224 of the pattern line 23. Although the recessed portion 290 does not need to be formed even at the board 224b, which is a dielectric, a recessed portion 290a contiguous to the recessed portion 290 may be formed at the board 224b, as required, by taking into consideration such cases, for example, where the stub 224 is largely cut and removed. Concrete examples of the insulating material are epoxy resin, silicone resin, or the like.

Figure 32A:
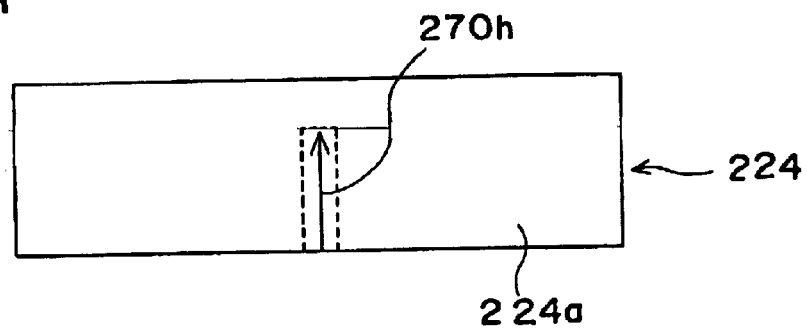
FIGS. 32A, 32B, 32C and 32D are explanatory views for explaining matching-circuit impedance adjusting methods according to a fifth embodiment of the present invention, respectively.
Figure 32B:
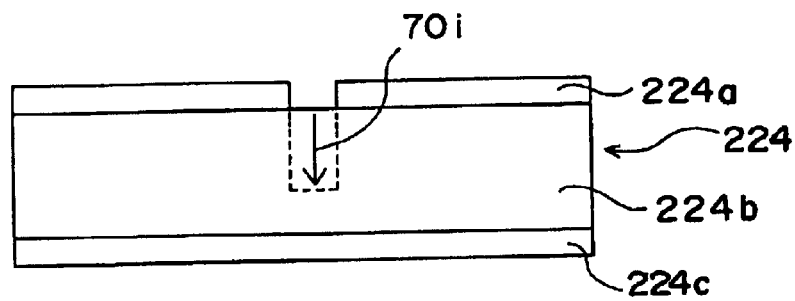
Figure 32C:
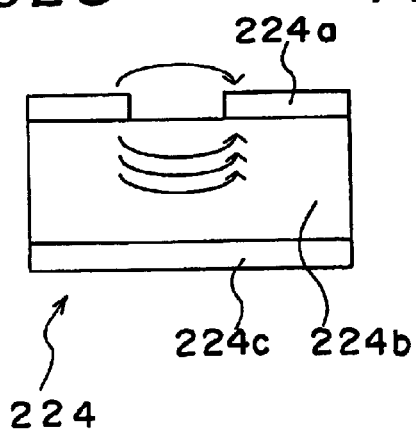
Figure 32D:
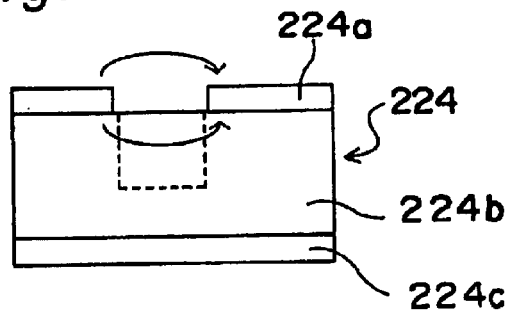
Figure 33:
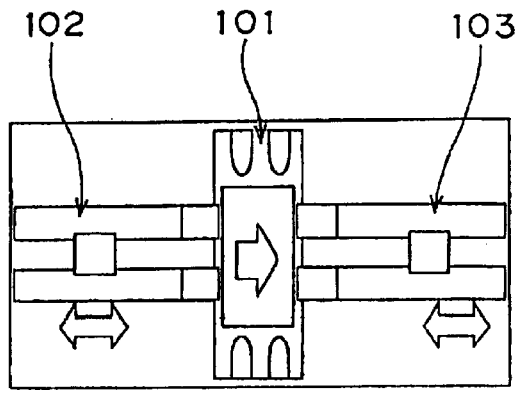
FIG. 33 is a schematic constitutional diagram of a power amplifier circuit for use in a base station for explaining an impedance adjusting method according to the prior art.

Also, as shown in FIGS. 32A–32D, as a fifth embodiment of the present invention, it is also possible to enable the fine adjustment in accordance with impedance characteristics by combining together a widthwise cutting-and-removing of the stub 224 of the pattern line 23 (see an arrow 270h in FIG. 32A) and a thicknesswise cutting-and-removing of the stub 224 of the pattern line 23 (see an arrow 70i in FIG. 32A). That is, with only the widthwise cutting-and-removing of the pattern line 23, the impedance adjustment is implementable only in one direction, i.e., a direction in which the impedance increases, in which case the impedance characteristics are affected by variations of physical constants of the dielectric forming the board 224b of the stub 224 of the pattern line 23, which may result in lower adjustment precision as well as longer time of adjustment work. In contrast to this, in the fifth embodiment of the present invention, taking advantage of the fact that increasing the widthwise cutting-and-removing amounts of the stub 224 of the pattern line 23 causes the impedance to increase while increasing the thicknesswise cutting-and-removing amounts of the stub 224 of the pattern line 23 causes the impedance to decrease, these two facets are combined. By so doing, fine adjustment in accordance with impedance characteristics is enabled. Accordingly, the impedance characteristic is improved and the yield can also be enhanced. Also, adjustment for the coupling amount of a $\lambda/4$ coupled circuit can also be achieved by adjusting the dielectric depth between patterns.

The impedance-adjustment method and apparatus according to the above embodiments are useful particularly for impedance-adjustment work involved in a matching circuit in a transmitting amplifier circuit which receives a carrier wave having at least one of image, voice, and character information, amplifies the wave signal, and then transmits the signal at a base station for telephones such as portable telephones. In recent years, as the applied frequency band to be used at telephone base stations shifts from 1 GHz to 2 GHz and further to 5 GHz, it is considered that the impedance adjustment work becomes very difficult because the crest of the sine curve of a carrier would largely vary even with a slight difference in the angle of the line depicting impedance variations on the Smith chart in the impedance adjustment work for matching circuits. For example, the sine curve of a carrier at 2 GHz comes in a cycle period corresponding to about one half of the sine curve of a carrier at 1 GHz. Therefore, in an attempt to change the impedance on the Smith chart, for example, for such adjustment that the crest portion of a sine curve is slightly shifted right or left, more or less wrong manipulation of hand in right-and-left adjustment would not largely affect the adjustment result in the case of adjustment with the sine curve of a carrier at 1 GHz, while even a slight wrong manipulation of hand in right-and-left adjustment would largely affect the adjustment result with the sine curve of a carrier at 2 GHz, thus the adjustment work being more difficult at 2 GHz than at 1 GHz. With the frequency over 2 GHz, higher precision in adjustment work is required, which means that there are some cases where adjustment work only by human hand is impossible. Furthermore, as the applied band shifts from 1 GHz to 2 GHz and further to 5 GHz, the attenuation factor increases, requiring the output to be large proportionally. Meanwhile, there is a need for preventing any interference of channels within the same band, and simultaneously transmitting a plurality of electric waves would involve interference of the frequency width, i.e. the capacity of electric waves with each other, causing the sine curve to collapse with the result of occurrence of distortion. In order to solve these issues, it is necessary to finely adjust the impedance in matching circuit, but conventional methods by human hand would have limitations naturally. Further, since semiconductor devices within transmitting amplifier circuits of this type for use at base stations subtly differ from lot to lot, the impedance adjusting method applied to the preceding lot could hardly be applied to another lot as it is, and the method for impedance adjustment work differs from lot to lot. Therefore, it becomes more and more difficult to apply adjustment work by human hand.

In contrast to this, according to the present invention, the impedance adjusting method allows the impedance adjustment work to be achieved easily and with high precision as described above, and is preferable since the method allows the impedance adjustment to be achieved easily and with high precision ensured and in short time even with a transmitting amplifier circuit for use at base station which receives a carrier wave having at least one of image, voice, and character information, amplifies the wave signal, and then transmits the signal.

Figure 34:
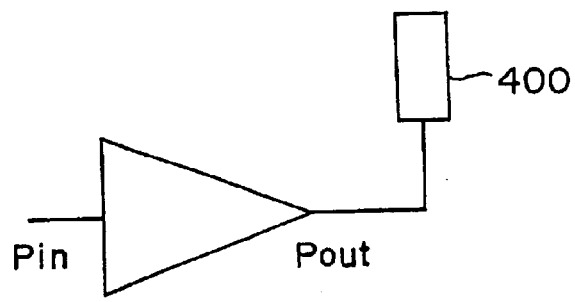
FIG. 34 is a view of a transmitting amplifier circuit as a more concrete example of the embodiments of the present invention.
Figure 35:
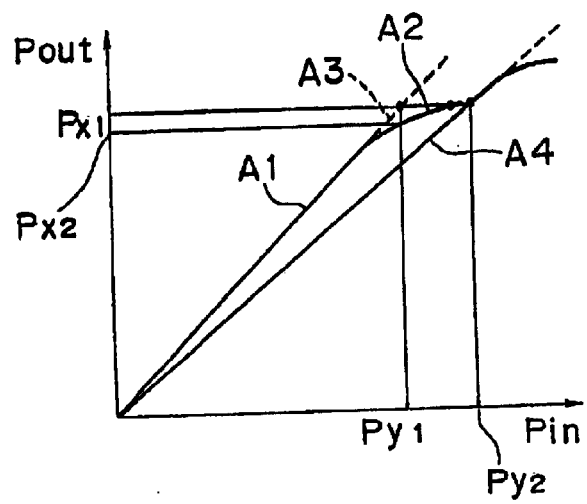
FIG. 35 is a view showing the relationship between a power input Pin and a power output Pout in the transmitting amplifier circuit of FIG. 34.

FIG. 34 shows an example of the transmitting amplifier circuit. It is assumed in the figure that a power input Pin is inputted to the transmitting amplifier circuit, a power output Pout is outputted, and the power output Pout side is connected to an antenna 400. In this case, for example, given that the power input Pin and the power output Pout are in a linear relation having a slope A1 as shown in FIG. 35, the obtainment of an output Px1 would involve only an input Py1 (see a dotted line A3). However, the linear relation between the power input Pin and the power output Pout collapses in the vicinity of Py1, resulting in a curved line as indicated by A2, in which case the input Py1 would produce an output Px2 larger than Px1, the output resulting in a distortion. Thus, by performing impedance adjustment in the matching circuit so that the slope A1 becomes a somewhat gentler slope as indicated by A4, the relationship between the power input Pin and the power output Pout is made to be a linear relation having a slope A4, where inputting Py1 allows an output of Px2, not so large as Px1 as it is, based on a linear relation, thus free from occurrence of any distortion. Performing impedance adjustment appropriately like this makes it possible to prevent even the occurrence of distortion.

It is noted that the matching circuit may be one having no capacitors in each of the foregoing embodiments.

It is also noted that optionally combining arbitrary embodiments among the foregoing various embodiments makes it possible to produce the advantageous effects of those individual embodiments.

According to the matching-circuit impedance adjusting method of the present invention, when the cut-out portion is cut out too much in cutting out the cut-out portion by cutting out an end portion of the stub for achievement of impedance adjustment, the stub can be made apparently longer by the formation of an auxiliary cut-and-removed portion, so that the impedance adjustment can be achieved easily and with high precision. In contrast to this, in the conventional method, in which indeed a stub is formed but the stub is merely cut out, cutting out the stub too much would cause the matching circuit to be disposed of, thus making it necessary to pay careful attention so that the stub would not be cut out too much by cutting out the stub in steps of infinitesimal degrees and, besides, making the cutting-out work or adjusting work time-consuming. On the other hand, in the present invention, even if the stub is cut out too much with the result of an excessively decreased impedance, forming the cut-and-removed portions makes it possible to obtain an apparently increased length of the stub. Therefore, the cutting-out of the stub can be achieved so that the impedance approaches the desired value, and thus the impedance adjustment can be achieved more easily and with higher precision.

Also, according to the matching-circuit impedance adjusting method of the present invention, based on the relationships among cutting-out amounts to be cut out, cutting-and-removing amounts to be cut and removed, and the impedances of a matching circuit, the cutting-out amount or cutting-and-removing amount or cutting-out amount and cutting-and-removing amount for adjusting the impedance of the matching circuit to a target value are determined by simulation, or by comparison operation of an impedance measured value with information in a database, and based on the amounts determined by simulation or by the comparison operation of the impedance measured value with the information stored in the database, the stub 224 of the pattern line is partly cut out or cut and removed or cut out and cut and removed, so that the impedance of the matching circuit is adjusted to the target value. Accordingly, the method is other than a method in which the impedance is adjusted to a target value, for example, by changing the mounting position of the capacitor on the pattern line, the pattern line can be shortened, allowing the mounting space to be reduced and moreover allowing the impedance adjustment to be achieved easily and with high precision. By contrast, in the conventional method, impedance adjustment is done by changing the mounting position of the chip capacitor on the pattern line, making it necessary for the pattern line to have at least such a length that the mounting position of the capacitor would be changeable, which inevitably involves lengthening the pattern line, thus resulting in an increased installation space and moreover requiring complex, time-consuming work such as the change of the mounting position of the capacitor. However, in the present invention, without the need for changing the mounting position, the pattern line can be reduced in its length while it is only required to merely partly cut and remove the stub of the pattern line. Thus, the elimination of the need for changing the mounting position eliminates the need for the mounting-position changing work.

Further, the operating section of the matching-circuit impedance adjusting apparatus of the present invention has an operating function at high frequencies, while relational information between cutting-out amounts or cutting-and-removing amounts or cutting-out amount and cutting-and-removing amounts of the stub of the pattern line in the matching circuit, and impedances characteristics, is stored in the storage section. By so doing, an amount of a cut-out portion or a position and an amount of an auxiliary cut-and-removed portion can be determined while a variation amount of the impedance (and the constant of a capacitor if the capacitor is provided) is predicted by simulation or by comparison operation of an impedance measured value with the information in the database. Thus, the conventional cut-and-dry method can be replaced, and the impedance adjustment can be achieved faster and with higher precision.

Also, whereas the conventional method has involved longer adjustment time due to human adjustment work as well as variations among workers, this adjusting apparatus is capable of performing the impedance adjustment almost automatically so that the adjustment can be achieved in shorter time and with less variations.

Furthermore, as another aspect of the present invention, the left-and-right cutting-out amounts or cutting-and-removing amounts or cutting-out amounts and cutting-and-removing amounts of the stubs of left-and-right pattern lines are made different between left and right, in which case it becomes possible to attain the left-and-right balance adjustment, so that impedance characteristics can be improved.

Further, as another aspect of the present invention, a thicknesswise cutting-and-removing amount of the stub of the pattern line is changed, in which case the move extent of impedance phase is reduced by deepening the thicknesswise cutting-and-removing amount of the stub of the pattern line, in particular, the cutting-and-removing depth of the base board under the conductor, making it possible to performed fine adjustment in accordance with impedance characteristics. Therefore, higher-precision adjustment can be achieved, which leads to better impedance characteristics and higher yield.

Further, as another aspect of the present invention, with a recessed portion previously formed along the thicknesswise direction of the stub of the pattern line, an insulating resin is buried in the recessed portion and then cut and removed to form an auxiliary cut-and-removed portion, in which case when fine adjustment is desired, it becomes possible to cut and remove the insulating resin to an infinitesimal extent more easily than to cut and remove the stub of the pattern line on a ceramic board or the like to an infinitesimal extent. Thus, fine adjustment in accordance with impedance characteristics can be achieved, which leads to better impedance characteristics and higher yield.

Further, as another aspect of the present invention, a widthwise cutting-and-removing of the stub of the pattern line and a thicknesswise cutting-and-removing of the stub of the pattern line are combined together, in which case fine adjustment can be achieved in accordance with impedance characteristics. Accordingly, the impedance characteristic is improved and the yield can also be enhanced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A matching-circuit impedance adjusting method for adjusting impedance of a matching circuit by, in a matching circuit having a pattern line, partly cutting out at least one stub protruding widthwise from the pattern line, said method comprising:

forming an auxiliary cut-and-removed portion by partly cutting and removing the at least one stub so that the at least one stub is made apparently longer;

measuring an impedance; and processing the auxiliary cut-and-remove portion until the auxiliary cut-and-remove portion is processed to reach a reference values, wherein said partly cutting and removing of the at least one stub of the pattern line to form the auxiliary cut-and-removed portion comprises forming a hook-type slit in the at least one stub of the pattern line.

2. A matching-circuit impedance adjusting method according to claim 1, further comprising:

based on a relationship between cutting-out amounts for partly cutting out the at least one stub of the pattern line and impedances of the matching circuit including a capacitor, and a relationship between cutting-and-removing amounts of the auxiliary cut-and-removed portion for partly cutting and removing the at least one stub and the impedances of the matching circuit, determining a cutting-out amount, a cutting-and-removing amount, or the cutting-out amount and the cutting-and-removing amount, for adjusting the impedance of the matching circuit to a target value by simulation or by a comparison operation of an impedance measured value with information in a database; and based on the cutting-out amount, the cutting-and-removing amount, or the cutting-out amount and the cutting-and-removing amount, of the at least one stub determined by the simulation or by the comparison operation of the impedance measured value with the information in the database, partly cutting out or cutting and removing the at least one stub, so that the impedance of the matching circuit is adjusted to the target value.

3. A matching-circuit impedance adjusting method according to claim 1, wherein said partly cutting and removing of the at least one stub to form the auxiliary cut-and-removed portion comprises forming at least one slit along a widthwise direction of the at least one stub.

4. A matching-circuit impedance adjusting method according to claim 3, wherein the at least one slit is three or more slits in the at least one stub of the pattern line so that the three or more slits are formed as comb-teeth-like cuts.

5. A matching-circuit impedance adjusting method according to claim 3, wherein the at least one slit is three or more slits in the at least one stub of the pattern line so that the three or more slits are formed as staggered cuts.

6. A matching-circuit impedance adjusting method according to claim 1, wherein said partly cutting and removing of the at least one stub of the pattern line to form the auxiliary cut-and-removed portion comprises forming a cut-out along a widthwise direction of the at least one stub of the pattern line.

7. A matching-circuit impedance adjusting method according to claim 1, wherein said forming of the auxiliary cut-and-removed portion comprises partly cutting and removing the at least one stub with a laser beam.

8. A matching-circuit impedance adjusting method according to claim 1, wherein a cutting-out amount, a cutting-and-removing amount, or the cutting-out amount and cutting-and-removing amount, of each of the at least one stub of the pattern line are different from one another.

9. A matching-circuit impedance adjusting method according to claim 1, further comprising changing a cutting-and-removing amount of the auxiliary cut-and-removed portion in a thicknesswise direction of the at least one stub of the pattern line, thereby performing the impedance adjustment.

10. A matching-circuit impedance adjusting method according to claim 1, wherein said forming of the auxiliary cut-and-removed portion comprises, with a recessed portion previously formed along a thicknesswise direction of the at least one stub of the pattern line, burying an insulating resin in the recessed portion and then cutting and removing the insulating resin to form the auxiliary cut-and-removed portion.

11. A matching-circuit impedance adjusting method according to claim 1, further comprising: performing fine adjustment in accordance with an impedance characteristic by combining a widthwise cutting-and-removing of the at least one stub of the pattern line and a thicknesswise cutting-and-removing of the at least one stub of the pattern line.

12. A matching-circuit impedance adjusting method according to claim 1, further comprising: with an impedance variation amount on a Smith chart changed by a length and a width of the auxiliary cut-and-removed portion, adjusting the impedance of the matching circuit to a target value based on a phase on the impedance.

* * * * *

UNITED STATES PATENT AND TRADEMARK OFFICE
CERTIFICATE OF CORRECTION

PATENT NO.    : 6,759,917 B2
DATED         : July 6, 2004
INVENTOR(S)   : Kazuhiro Ikurumi et al.

It is certified that error appears in the above-identified patent and that said Letters Patent is hereby corrected as shown below:

Column 25,
Line 10, replace "values" with -- value --.

Column 26,
Lines 35 and 42, replace "comprising:" with -- comprising --.

Signed and Sealed this

Thirtieth Day of November, 2004

JON W. DUDAS
*Director of the United States Patent and Trademark Office*